(12) United States Patent
Liao et al.

(10) Patent No.: US 10,847,470 B2
(45) Date of Patent: Nov. 24, 2020

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Guo-Cheng Liao, Kaohsiung (TW); Chia Ching Chen, Kaohsiung (TW); Yi Chuan Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/889,004

(22) Filed: Feb. 5, 2018

(65) Prior Publication Data

US 2019/0244907 A1 Aug. 8, 2019

(51) Int. Cl.

| H01L 23/538 | (2006.01) |
|---|---|
| H01L 23/31 | (2006.01) |
| H01L 23/552 | (2006.01) |
| H01L 23/00 | (2006.01) |
| H01L 21/48 | (2006.01) |
| H01L 21/56 | (2006.01) |
| H01L 21/683 | (2006.01) |

(52) U.S. Cl.
CPC ...... *H01L 23/5389* (2013.01); *H01L 21/4853* (2013.01); *H01L 21/4857* (2013.01); *H01L 21/561* (2013.01); *H01L 21/565* (2013.01); *H01L 21/6835* (2013.01); *H01L 23/3114* (2013.01); *H01L 23/3135* (2013.01); *H01L 23/5383* (2013.01); *H01L 23/5386* (2013.01); *H01L 23/552* (2013.01); *H01L 24/19* (2013.01); *H01L 24/20* (2013.01); *H01L 21/568* (2013.01); *H01L 23/3128* (2013.01); *H01L 2221/68345* (2013.01); *H01L 2221/68359* (2013.01); *H01L 2221/68372* (2013.01); *H01L 2224/214* (2013.01); *H01L 2924/19041* (2013.01); *H01L 2924/19105* (2013.01); *H01L 2924/3025* (2013.01)

(58) Field of Classification Search
None
See application file for complete search history.

(56) References Cited

U.S. PATENT DOCUMENTS 9,056,763 B2 6/2015 Geissler et al.
9,368,563 B2 6/2016 Lin et al.
(Continued)

*Primary Examiner* — Zandra V Smith
*Assistant Examiner* — Lawrence C Tynes, Jr.
(74) *Attorney, Agent, or Firm* — Foley & Lardner LLP

(57) ABSTRACT

A semiconductor package structure includes a first conductive structure, a second conductive structure, a first semiconductor component, a second semiconductor component and a first encapsulant. The first semiconductor component is disposed on the first conductive structure. The first conductive structure includes a first redistribution layer. The second semiconductor component is disposed on the second conductive structure. The second conductive structure includes a second redistribution layer, and the first conductive structure is electrically connected to the second conductive structure. The first encapsulant covers the first semiconductor component and the first conductive structure. A lateral surface of the first conductive structure and a lateral surface of the first encapsulant are non-coplanar.

3 Claims, 17 Drawing Sheets

(56) References Cited

U.S. PATENT DOCUMENTS

| | | | |
|---|---|---|---|
| 9,607,919 B2 | 3/2017 | Lee et al. | |
| 2013/0328204 A1* | 12/2013 | Zommer | B23K 1/20 |
| | | | 257/765 |
| 2015/0084206 A1* | 3/2015 | Lin | H01L 23/3135 |
| | | | 257/774 |
| 2015/0255361 A1* | 9/2015 | Lee | H01L 23/3135 |
| | | | 257/738 |
| 2017/0263544 A1* | 9/2017 | Hiner | H01L 21/56 |
| 2018/0158779 A1* | 6/2018 | Yang | H01L 24/96 |
| 2018/0294233 A1* | 10/2018 | Yoon | H01L 23/49838 |

\* cited by examiner

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure including a redistribution layer (RDL), and a method for manufacturing the semiconductor package structure.

2. Description of the Related Art

In a fan-out process, at least one high-end semiconductor die and at least one low-end semiconductor die can be encapsulated in an encapsulant concurrently. Then, an RDL is formed on the encapsulant to electrically connect the high-end semiconductor die and the low-end semiconductor die. However, the high-end semiconductor die may be expensive; thus, a yield loss of the RDL can increase the cost of the fan-out process.

SUMMARY

In some embodiments, according to an aspect, a semiconductor package structure includes a first conductive structure, a second conductive structure, a first semiconductor component, a second semiconductor component and a first encapsulant. The first semiconductor component is disposed on the first conductive structure. The first conductive structure includes a first redistribution layer. The second semiconductor component is disposed on the second conductive structure. The second conductive structure includes a second redistribution layer, and the first conductive structure is electrically connected to the second conductive structure. The first encapsulant covers the first semiconductor component and the first conductive structure. A lateral surface of the first conductive structure and a lateral surface of the first encapsulant are non-coplanar.

In some embodiments, according to another aspect, a method for manufacturing a semiconductor package structure includes: (a) forming a base wiring structure on a first carrier, wherein the base wiring structure includes a first redistribution layer; (b) singulating the base wiring structure to form a plurality of first conductive structures; (c) disposing the first conductive structures on a second carrier; (d) disposing a first semiconductor component on a respective one of the first conductive structures; and (e) forming a first encapsulant to cover the first semiconductor component and a lateral surface of the first conductive structure.

BRIEF DESCRIPTION OF THE DRAWINGS

Characteristics of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
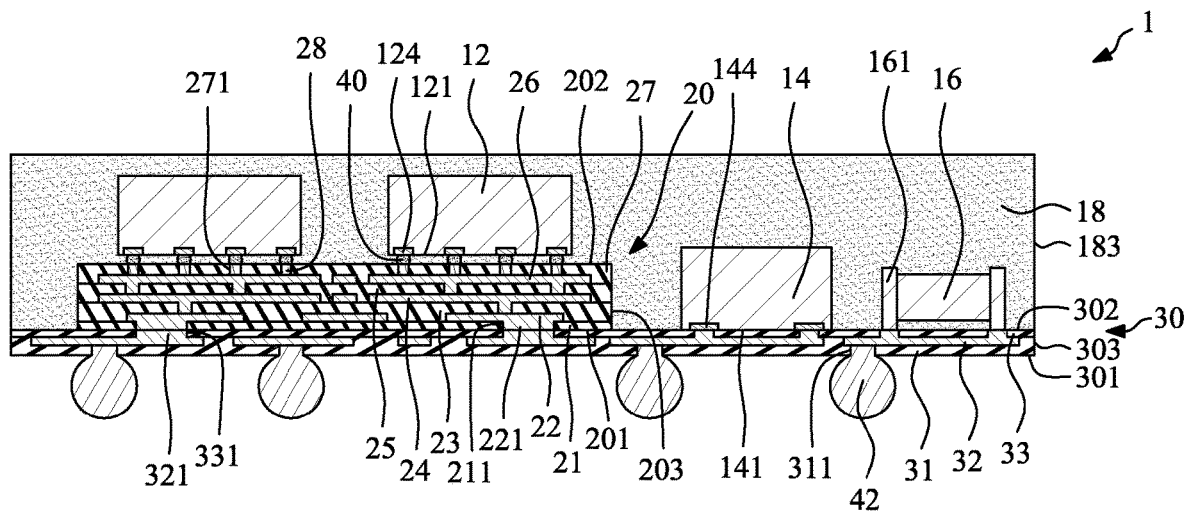
FIG. 1 illustrates a cross-sectional view of some embodiments of a semiconductor package structure according to an aspect of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure are directed to a semiconductor package structure including a first semiconductor component disposed on a first conductive structure, and a first encapsulant covering the first semiconductor component and the first conductive structure, wherein a lateral surface of the first conductive structure and a lateral surface of the first encapsulant are non-coplanar. At least some embodiments of the present disclosure are directed to techniques for manufacturing the semiconductor package structure.

In a first comparative fan-out process, a plurality of semiconductor dice (including at least one high-end semiconductor die and at least one low-end semiconductor die) are disposed in a "face down" manner on a carrier. Each of the semiconductor dice has an active surface and a back side surface opposite to the active surface, and the active surface of the semiconductor die is attached (e.g., adhered) to the carrier. Then, a molding compound is applied to cover the semiconductor dice and the carrier. Then, the carrier is removed so that the active surfaces of the semiconductor dice may be exposed from a surface of the molding compound. Alternatively, conductive pillars disposed on the active surfaces of the semiconductor dice may be exposed from a surface of the molding compound. Then, at least one fine-line RDL is formed on the surface of the molding compound to electrically connect the semiconductor dice (including the high-end semiconductor die and the low-end semiconductor die). The high-end semiconductor die and the low-end semiconductor die are encapsulated in the molding compound concurrently, and are electrically connected to each other through the same fine-line RDL. It is noted that the high-end semiconductor die may be formed from a first wafer, and the low-end semiconductor die may be formed from a second wafer. A wafer node of the first wafer may lead a wafer node of the second wafer by more than two generations. For example, the first wafer may be a 20 nanometer (nm) or less node wafer, such as a 14 nm or less node wafer, a 7 nm or less node wafer, or less; and the second wafer may be a 20 nm or more node wafer, such as a 28 nm or more node wafer, a 32 nm or more node wafer, or greater. For example, a bump pad pitch of the high-end semiconductor die may be less than 50 micrometers (μm), and a bump pad pitch of the low-end semiconductor die may be greater than 100 μm. Therefore, the high-end semiconductor die may be expensive as compared with the low-end semiconductor die. In addition, the yield of the fine-line RDL can be lower than 100%, thus, the yield loss of the fine-line RDL will make some final package structures fail (and thus waste the high-end semiconductor die), which increases the cost of such fan-out process.

In a second comparative fan-out process, at least one fine-line RDL is formed on a carrier. Then, a plurality of semiconductor dice (including at least one high-end semiconductor die and at least one low-end semiconductor die) are disposed in a "face down" manner on the fine-line RDL. Each of the semiconductor dice has an active surface and a back side surface opposite to the active surface, and the active surface of the semiconductor die is electrically connected to the fine-line RDL. Then, a molding compound is applied to cover the semiconductor dice and the fine-line RDL. The high-end semiconductor die and the low-end semiconductor die are encapsulated in the molding compound concurrently, and are electrically connected to each other through the same fine-line RDL. Then, the carrier is removed. As stated above, the high-end semiconductor die can be expensive as compared with the low-end semiconductor die. Thus, the yield loss of the fine-line RDL can increase the cost of such a fan-out process.

The present disclosure addresses at least the above concerns and provides an improved semiconductor package structure, and improved techniques for manufacturing the semiconductor package structure. In the manufacturing process of the semiconductor package structure, a known good conductive structure (a conductive structure ascertained or assumed to be good (e.g. functional as intended)) including a fine-line redistribution layer is attached to a high-end semiconductor die. Thus, the cost of the manufacturing process is reduced.

FIG. 1 illustrates a cross sectional view of some embodiments of a semiconductor package structure 1 according to an aspect of the present disclosure. The semiconductor package structure 1 includes at least one first semiconductor component (including, for example, at least one high-end semiconductor die 12), a first conductive structure 20, at least one second semiconductor component (including, for example, a low-end semiconductor die 14 and a passive element 16, such as a multilayer ceramic capacitor (MLCC)), a second conductive structure 30, a first encapsulant 18 and a plurality of external connectors 42 (e.g., solder bumps).

The first conductive structure 20 may include at least one first passivation layer and at least one first redistribution layer. For example, the first conductive structure 20 may include three first passivation layers and two first redistribution layers disposed therebetween, or the first conductive structure 20 may include four first passivation layers and three first redistribution layers disposed therebetween, for example. Other combinations of passivation layer(s) and redistribution layer(s) may also be implemented. As shown in FIG. 1, the first conductive structure 20 includes four first passivation layers (including, for example, a first bottom passivation layer 21, two first intermediate passivation layers 23, 25 and a first top passivation layer 27) and three first redistribution layers (including, for example, a first bottom redistribution layer 22, a first intermediate redistribution layer 24 and a first top redistribution layer 26) disposed therebetween.

The first bottom passivation layer 21 may include, or be formed from, a photoresist layer, a cured photosensitive material, a cured photoimageable dielectric (PID) material such as a polyamide (PA), a polyimide (PI), an epoxy or polybenzoxazole (PBO), or a combination of two or more thereof. In one or more embodiments, the first bottom passivation layer 21 may include, or be formed from a dry film type material that includes a resin and a plurality of fillers. In another embodiment, the first bottom passivation layer 21 may include, or be formed from a liquid type material that includes a homogeneous resin without fillers. As shown in FIG. 1, the first bottom passivation layer 21 may define at least one through hole 211 extending through the first bottom passivation layer 21.

The first bottom redistribution layer 22 is disposed on the first bottom passivation layer 21 and embedded in the first intermediate passivation layer 23. For example, the first bottom redistribution layer 22 may include a seed layer and a conductive metal layer disposed in that order on the first bottom passivation layer 21. The seed layer may include, for example, titanium and/or copper, another metal, or an alloy, and may be formed or disposed by sputtering. The conductive metal layer may include, for example, copper, or another metal or combination of metals, and may be formed or disposed by electroplating. In some embodiments, as shown in FIG. 1, the first bottom redistribution layer 22 may include at least one extending portion 221 disposed in the through hole 211 of the first bottom passivation layer 21. The extending portion 221 of the first bottom redistribution layer 22 is exposed from the bottom surface of the first bottom passivation layer 21.

The first intermediate passivation layer 23 is disposed on the first bottom passivation layer 21, and covers the first bottom redistribution layer 22. The first intermediate redistribution layer 24 is disposed on the first intermediate passivation layer 23, and is electrically connected to the first bottom redistribution layer 22. The first intermediate passivation layer 25 is disposed on the first intermediate passivation layer 23, and covers the first intermediate redistribution layer 24. The first top redistribution layer 26 is disposed on the first intermediate passivation layer 25, and is electrically connected to the first intermediate redistribution layer 24. The first top passivation layer 27 is disposed on the first intermediate passivation layer 25, and covers the first top redistribution layer 26. As shown in FIG. 1, the first top passivation layer 27 may define a plurality of through holes 271 extending through the first top passivation layer 27 to expose portions of the first top redistribution layer 26. A plurality of conductive materials 28 (e.g., pre-solder materials) may be disposed in the respective ones of the through holes 271 of the first top passivation layer 27 to contact the first top redistribution layer 26.

The first conductive structure 20 may have a first surface 201, a second surface 202 and a lateral surface 203. The second surface 202 is opposite to the first surface 201, and the lateral surface 203 extends between the first surface 201 and the second surface 202. As shown in FIG. 1, the first surface 201 of the first conductive structure 20 is the bottom surface of the first bottom passivation layer 21, and the second surface 202 of the first conductive structure 20 is the top surface of the first top passivation layer 27. In one or more embodiments, a line width/line space (L/S) of the first redistribution layers (including, for example, the first bottom redistribution layer 22, the first intermediate redistribution layer 24 and the first top redistribution layer 26) of the first conductive structure 20 may be equal to or less than about 2 μm/about 2 μm (such as, for example, about 1.8 μm/about 1.8 μm or less, about 1.6 μm/about 1.6 μm or less, or about 1.4 μm/about 1.4 μm or less).

The high-end semiconductor die 12 may be formed from a first wafer, and the low-end semiconductor die 14 may be formed from a second wafer. The wafer node of the first wafer may lead the wafer node of the second wafer by more than two generations. For example, the first wafer may be a 20 nm or less node wafer, such as a 14 nm or less node wafer, a 7 nm or less node wafer, or less; and the second wafer may be a 20 nm or more node wafer, such as a 28 nm or more node, a 32 nm or more node, or greater. For example, a bump pad pitch (e.g., a pitch between the bump pads 124) of the high-end semiconductor die 12 may be less than about 50 µm (e.g. about 47 µm or less, about 44 µm or less, or about 41 µm or less), and a bump pad pitch (e.g., a pitch between the bump pads 144) of the low-end semiconductor die 14 may be greater than about 100 µm (e.g. about 105 µm or more, about 110 µm or more, or about 115 µm or more). The high-end semiconductor die 12 can be expensive as compared with the low-end semiconductor die 14.

The first semiconductor component (including, for example, the at least one high-end semiconductor die 12) is disposed on the first conductive structure 20. In one or more embodiments, the first semiconductor component (including, for example, the at least one high-end semiconductor die 12) may include a plurality of conductive bumps 40 and a plurality of bump pads 124 disposed adjacent to the active surface 121 thereof. One end of each of the conductive bumps 40 respectively contacts the respective bump pads 124 of the first semiconductor component (including, for example, the at least one high-end semiconductor die 12), and the other end of each of the conductive bumps 40 respectively contacts a respective one of the conductive materials 28 (e.g., pre-solder materials) in the respective ones of the through holes 271 of the first top passivation layer 27 so that the first semiconductor component (including, for example, the at least one high-end semiconductor die 12) is electrically connected to the first top redistribution layer 26 of the first conductive structure 20 through the conductive bumps 40. The first semiconductor component (including, for example, the at least one high-end semiconductor die 12) is attached to the first conductive structure 20 by flip chip bonding. An underfill may be further included in a space between the active surface 121 of the first semiconductor component (including, for example, the at least one high-end semiconductor die 12) and the second surface 202 of the first conductive structure 20 to cover and protect the conductive bumps 40.

The second conductive structure 30 may include at least one second passivation layer and at least one second redistribution layer. For example, the second conductive structure 30 may include three second passivation layers and two second redistribution layers disposed therebetween, or the second conductive structure 30 may include two second passivation layers and a second redistribution layer disposed therebetween, for example. Other combinations of passivation layer(s) and redistribution layer(s) may also be implemented. As shown in FIG. 1, the second conductive structure 30 includes two second passivation layers (including, for example, a second bottom passivation layer 31 and a second top passivation layer 33) and a second redistribution layers 32 disposed therebetween.

The second top passivation layer 33 may include, or be formed from, a photoresist layer, a cured photosensitive material, a cured PID material such as a PA, a PI, an epoxy or PBO, or a combination of two or more thereof. In one or more embodiments, the second top passivation layer 33 may include, or be formed from a dry film type material that includes a resin and a plurality of fillers. In another embodiment, the second top passivation layer 33 may include, or be formed from a liquid type material that includes a homogeneous resin without fillers. As shown in FIG. 1, the second top passivation layer 33 may define at least one through hole 331 extending through the second top passivation layer 33.

The second redistribution layer 32 is disposed on the second top passivation layer 33 and embedded in the second bottom passivation layer 31. For example, the second redistribution layer 32 may include a seed layer and a conductive metal layer disposed in that order on the second top passivation layer 33. The seed layer may include, for example, titanium and/or copper, another metal, or an alloy, and may be formed or disposed by sputtering. The conductive metal layer may include, for example, copper, or another metal or combination of metals, and may be formed or disposed by electroplating. In some embodiments, as shown in FIG. 1, the second redistribution layer 32 may include at least one extending portion 321 disposed in the through hole 331 of the second top passivation layer 33. The extending portion 321 of the second redistribution layer 32 is exposed from the top surface of the second top passivation layer 33.

The second bottom passivation layer 31 is disposed on the second top passivation layer 33, and covers the second redistribution layer 32. As shown in FIG. 1, the second bottom passivation layer 31 may define a plurality of through holes 311 extending through the second bottom passivation layer 31 to expose portions of the second redistribution layer 32. The external connectors 42 (e.g., solder bumps) may be disposed in the respective ones of the through holes 311 of the second bottom passivation layer 31 to contact the second redistribution layer 32 for external connection.

The second conductive structure 30 may have a first surface 301, a second surface 302 and a lateral surface 303. The second surface 302 is opposite to the first surface 301, and the lateral surface 303 extends between the first surface 301 and the second surface 302. As shown in FIG. 1, the first surface 301 of the second conductive structure 30 is the bottom surface of the second bottom passivation layer 31, and the second surface 302 of the second conductive structure 30 is the top surface of the second top passivation layer 33. In one or more embodiments, a line width and a line space (L/S) of the first redistribution layers (including, for example, the first bottom redistribution layer 22, the first intermediate redistribution layer 24 and the first top redistribution layer 26) of the first conductive structure 20 is smaller than a line width and a line space (L/S) of the second redistribution layer 32 of the second conductive structure 30. For example, a line width/line space (L/S) of the second redistribution layer 32 of the second conductive structure 30 may be greater than about 5 µm/about 5 µm, or greater than about 7 µm/about 7 µm. In addition, an area of the second conductive structure 30 is greater than an area of the first conductive structure 20 from a top view (e.g. greater by a factor of about 1.1 or more, about 1.2 or more, or about 1.3 or more).

The first conductive structure 20 is electrically connected to the second conductive structure 30. In one embodiment for manufacturing the semiconductor package structure 1 of FIG. 1, the second conductive structure 30 is formed on the first conductive structure 20 and the first encapsulant 18 directly. The second surface 302 of the second conductive structure 30 contacts the first surface 201 of the first conductive structure 20 directly, and the extending portion 321 of the second redistribution layer 32 contacts the extending portion 221 of the first bottom redistribution layer 22. Therefore, the first bottom redistribution layer 22 of the first conductive structure 20 is electrically connected to the second redistribution layer 32 of the second conductive structure 30 through the extending portion 221 and the extending portion 321.

The second semiconductor component (including, for example, a low-end semiconductor die 14 and a passive element 16, e.g., an MLCC) is disposed on the second conductive structure 30. The low-end semiconductor die 14 may have an active surface 141 and include a plurality of bumps pads 144 disposed adjacent to the active surface 141. The second surface 302 of the second conductive structure 30 may contact the active surface 141 of the low-end semiconductor die 14 directly, and some of the extending portions 321 of the second redistribution layer 32 may contact the bumps pads 144 of the low-end semiconductor die 14. The passive element 16 may include at least one electrode 161, and some of the extending portions 321 of the second redistribution layer 32 may contact the electrode 161 of the passive element 16. Therefore, the second semiconductor component (including, for example, the low-end semiconductor die 14 and the passive element 16, e.g., an MLCC)) is electrically connected to the second redistribution layer 32 of the second conductive structure 30 through the extending portions 321.

The first encapsulant 18, for example, a molding compound, covers the first semiconductor component (including, for example, at least one high-end semiconductor die 12) and the first conductive structure 20. The lateral surface 203 of the first conductive structure 20 and a lateral surface 183 of the first encapsulant 18 are non-coplanar. As shown in FIG. 1, the first encapsulant 18 further covers the lateral surface 203 of the first conductive structure 20. In one embodiment for manufacturing the semiconductor package structure 1 of FIG. 1, the first conductive structure 20 and the first encapsulant 18 are not cut concurrently at a stage, and the lateral surface 203 of the first conductive structure 20 is not coplanar with the lateral surface 183 of the first encapsulant 18. In an embodiment illustrated in FIG. 1, the first encapsulant 18 further covers the second semiconductor component (including, for example, the low-end semiconductor die 14 and the passive element 16, e.g., an MLCC) and the second surface 302 of the second conductive structure 30. The lateral surface 183 of the first encapsulant 18 is substantially coplanar with the lateral surface 303 of the second conductive structure 30, and the first encapsulant 18 and the second conductive structure 30 may be cut concurrently at a stage of manufacture.

In one embodiment, the first conductive structure 20 is a known good conductive structure that is tested and cut, and then the first semiconductor component (including, for example, at least one high-end semiconductor die 12) is attached to the known good first conductive structure 20. In addition, the yield rate of the second conductive structure 30 is relatively high. Therefore, the yield rate of the semiconductor package structure 1 is improved. That is, the risk that the first semiconductor component (including, for example, at least one high-end semiconductor die 12) be included in a failed package structure is low. As a result, the cost of a fan-out process is reduced efficiently.

Figure 2:
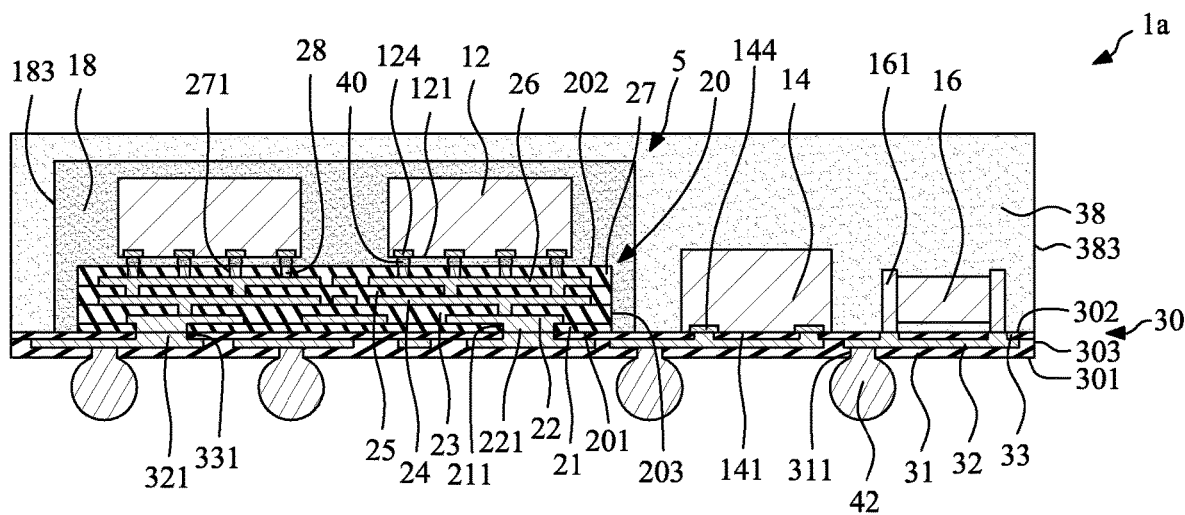
FIG. 2 illustrates a cross-sectional view of some embodiments of a semiconductor package structure according to an aspect of the present disclosure.

FIG. 2 illustrates a cross-sectional view of some embodiments of a semiconductor package structure 1a according to an aspect of the present disclosure. The semiconductor package structure 1a of FIG. 2 is similar to the semiconductor package structure 1 as shown in FIG. 1, except that the first encapsulant 18 covers the first semiconductor component (including, for example, at least one high-end semiconductor die 12) and the first conductive structure 20 to form an unit package 5. The first encapsulant 18 does not cover the second semiconductor component (including, for example, the low-end semiconductor die 14 and the passive element 16, e.g., an MLCC). The semiconductor package structure 1a further includes a second encapsulant 38 to cover the second semiconductor component (including, for example, the low-end semiconductor die 14 and the passive element 16, e.g., an MLCC) and a portion of the second conductive structure 30. A lateral surface 383 of the second encapsulant 38 is substantially coplanar with the lateral surface 303 of the second conductive structure 30, and the second encapsulant 38 and the second conductive structure 30 may be cut concurrently at a stage of manufacture. As shown in FIG. 2, the second encapsulant 38 further covers the first encapsulant 18 of the unit package 5. In one embodiment, the second encapsulant 38 may contact the surfaces of the first encapsulant 18. A material of the second encapsulant 38 may be same as or different from a material of the first encapsulant 18. For example, a size of the fillers in the first encapsulant 18 is less than a size of the fillers in the second encapsulant 38 (e.g. the size of the fillers in the first encapsulant 18 may be about 0.9 times the size of the fillers in the second encapsulant 38 or less, about 0.8 times the size of the fillers in the second encapsulant 38 or less, or about 0.7 times the size of the fillers in the second encapsulant 38 or less).

Figure 3:
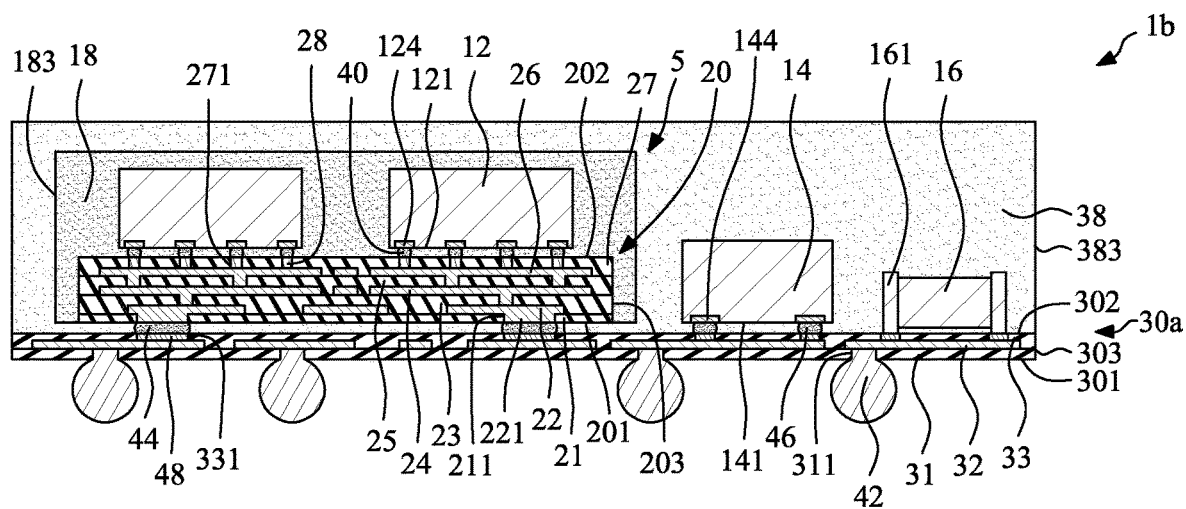
FIG. 3 illustrates a cross-sectional view of some embodiments of a semiconductor package structure according to an aspect of the present disclosure.

FIG. 3 illustrates a cross-sectional view of some embodiments of a semiconductor package structure 1b according to an aspect of the present disclosure. The semiconductor package structure 1b of FIG. 3 is similar to the semiconductor package structure 1a as shown in FIG. 2, except for the structure of the second conductive structure 30a. In the second conductive structure 30a, the second redistribution layer 32 is disposed on the second bottom passivation layer 31 and embedded in the second top passivation layer 33. As shown in FIG. 3, the second top passivation layer 33 may define a plurality of through holes 331 extending through the second top passivation layer 33 to expose portions of the second redistribution layer 32. A plurality of conductive materials 48 (e.g., pre-solder materials) may be disposed in the respective ones of the through holes 331 of the second top passivation layer 33 to contact the second redistribution layer 32.

The semiconductor package structure 1b may include a plurality of conductive bumps 44. One end of at least some of the conductive bumps 44 contacts the extending portion 221 of the first bottom redistribution layer 22 of the unit package 5, and the respective other end of the at least some conductive bumps 44 contacts a respective one of the conductive materials 48 (e.g., pre-solder materials) in the respective ones of the through holes 331 of the second top passivation layer 33 so that the unit package 5 is electrically connected to the second redistribution layer 32 of the second conductive structure 30a through the conductive bumps 44. An underfill may be further included in a space between the bottom surface of the unit package 5 and the second surface 302 of the second conductive structure 30a to cover and protect the conductive bumps 44. Similarly, the second semiconductor component (including, for example, the low-end semiconductor die 14 and the passive element 16, e.g., an MLCC) may be attached to the second surface 302 of the second conductive structure 30a through the conductive bumps 44 by flip chip bonding.

Figure 4:
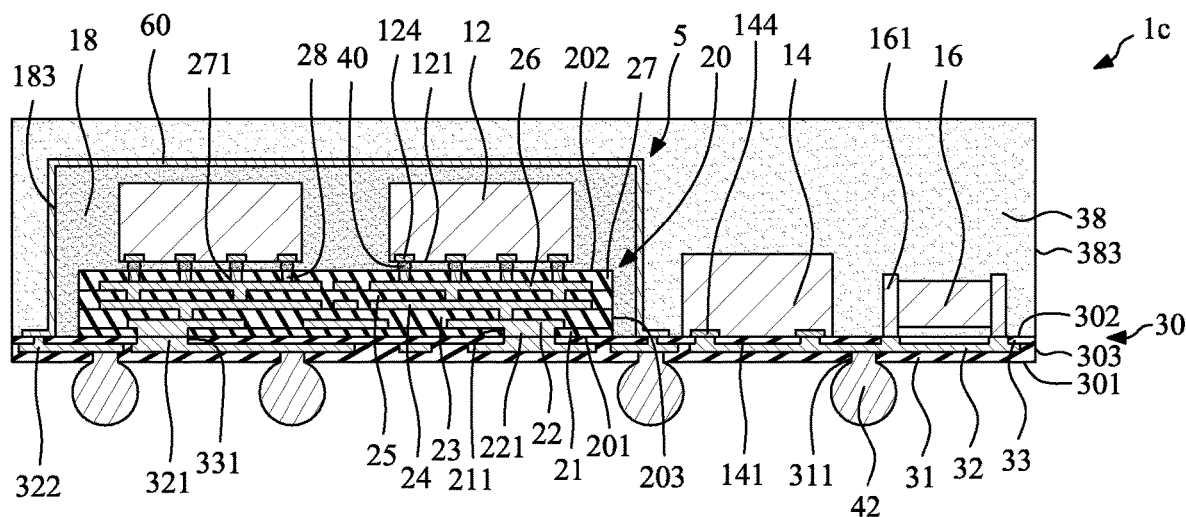
FIG. 4 illustrates a cross-sectional view of some embodiments of a semiconductor package structure according to an aspect of the present disclosure.

FIG. 4 illustrates a cross-sectional view of some embodiments of a semiconductor package structure 1c according to an aspect of the present disclosure. The semiconductor package structure 1c of FIG. 4 is similar to the semiconductor package structure 1a as shown in FIG. 2, except that the unit package 5 of the semiconductor package structure 1c further includes a shielding layer 60. The shielding layer 60 covers the first encapsulant 18 and is electrically connected to the second conductive structure 30. The shielding layer 60 may be electrically connected to a ground pad 322 of the second redistribution layer 32 of the second conductive structure 30. In some embodiments, the shielding layer 60 may include one or more metal layers, and may extend to contact the second surface 302 of the second conductive structure 30.

Figure 5:
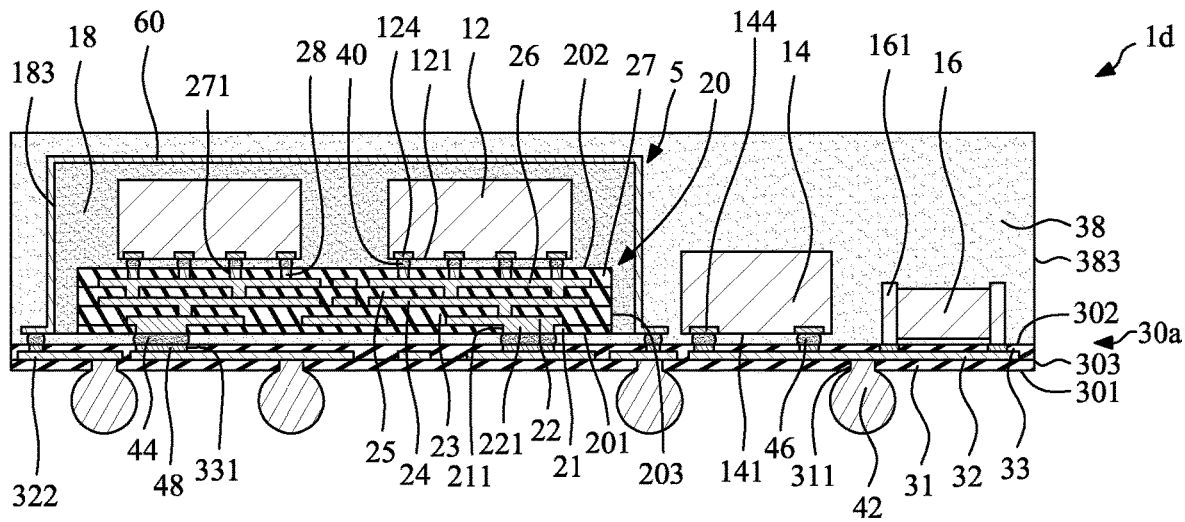
FIG. 5 illustrates a cross-sectional view of some embodiments of a semiconductor package structure according to an aspect of the present disclosure.

FIG. 5 illustrates a cross-sectional view of some embodiments of a semiconductor package structure 1d according to an aspect of the present disclosure. The semiconductor package structure 1d of FIG. 5 is similar to the semiconductor package structure 1c as shown in FIG. 4, except for the structure of the second conductive structure 30a. In the second conductive structure 30a, the second redistribution layer 32 is disposed on the second bottom passivation layer 31 and embedded in the second top passivation layer 33. As shown in FIG. 5, the second top passivation layer 33 may define a plurality of through holes 331 extending through the second top passivation layer 33 to expose portions of the second redistribution layer 32. A plurality of conductive materials 48 (e.g., pre-solder materials) may be disposed in the respective ones of the through holes 331 of the second top passivation layer 33 to contact the second redistribution layer 32.

The semiconductor package structure 1d may include a plurality of conductive bumps 44. One end of at least some of the conductive bumps 44 contacts the extending portion 221 of the first bottom redistribution layer 22 of the unit package 5, and the other respective end of the at least some conductive bumps 44 contacts a respective one of the conductive materials 48 (e.g., pre-solder materials) in the respective ones of the through holes 331 of the second top passivation layer 33 so that the unit package 5 is electrically connected to the second redistribution layer 32 of the second conductive structure 30a through the conductive bumps 44. In addition, the shielding layer 60 of the unit package 5 may be electrically connected to the ground pad 322 of the second redistribution layer 32 of the second conductive structure 30a through the conductive bumps 44. An underfill may be further included in a space between the bottom surface of the unit package 5 and the second surface 302 of the second conductive structure 30a to cover and protect the conductive bumps 44. Similarly, the second semiconductor component (including, for example, the low-end semiconductor die 14 and the passive element 16, e.g., an MLCC) may be attached to the second surface 302 of the second conductive structure 30a through the conductive bumps 44 by flip chip bonding.

Figure 6:
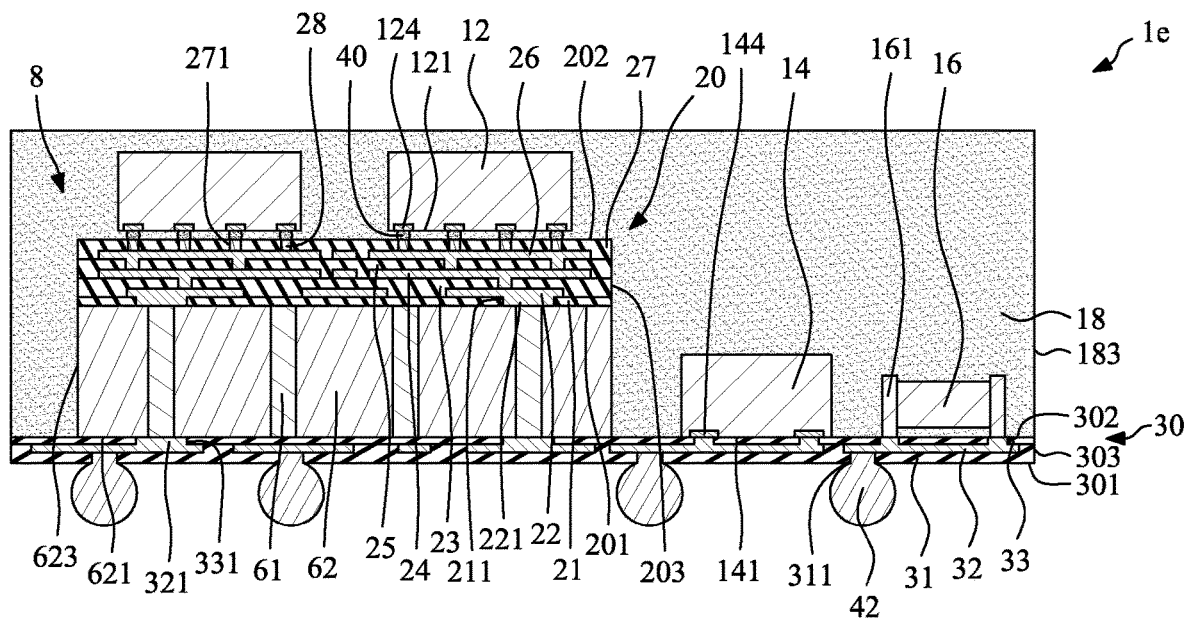
FIG. 6 illustrates a cross-sectional view of some embodiments of a semiconductor package structure according to an aspect of the present disclosure.

FIG. 6 illustrates a cross-sectional view of some embodiments of a semiconductor package structure 1e according to an aspect of the present disclosure. The semiconductor package structure 1e of FIG. 6 is similar to the semiconductor package structure 1 as shown in FIG. 1, except that the semiconductor package structure 1e further includes an interposer 62 interposed between the first conductive structure 20 and the second conductive structure 30. The interposer 62 includes a plurality of through vias 61 electrically connecting the first conductive structure 20 and the second conductive structure 30. The material of the interposer 62 may include glass, and the material of the through via 61 may include copper or another conductive metal. During a manufacturing process, the interposer 62 and the first conductive structure 20 can be cut concurrently at a stage to form a sub-package 8. A lateral surface 623 of the interposer 62 is substantially coplanar with the lateral surface 203 of the first conductive structure 20. As shown in FIG. 6, one end of the through via 61 contacts the extending portion 221 of the first bottom redistribution layer 22, and the other end of the through via 61 contacts the extending portion 321 of the second redistribution layer 32 so that the first conductive structure 20 is electrically connected to the second conductive structure 30 through the through vias 61, and a first surface 621 of the interposer 62 contacts the second surface 302 of the second conductive structure 30.

Figure 7:
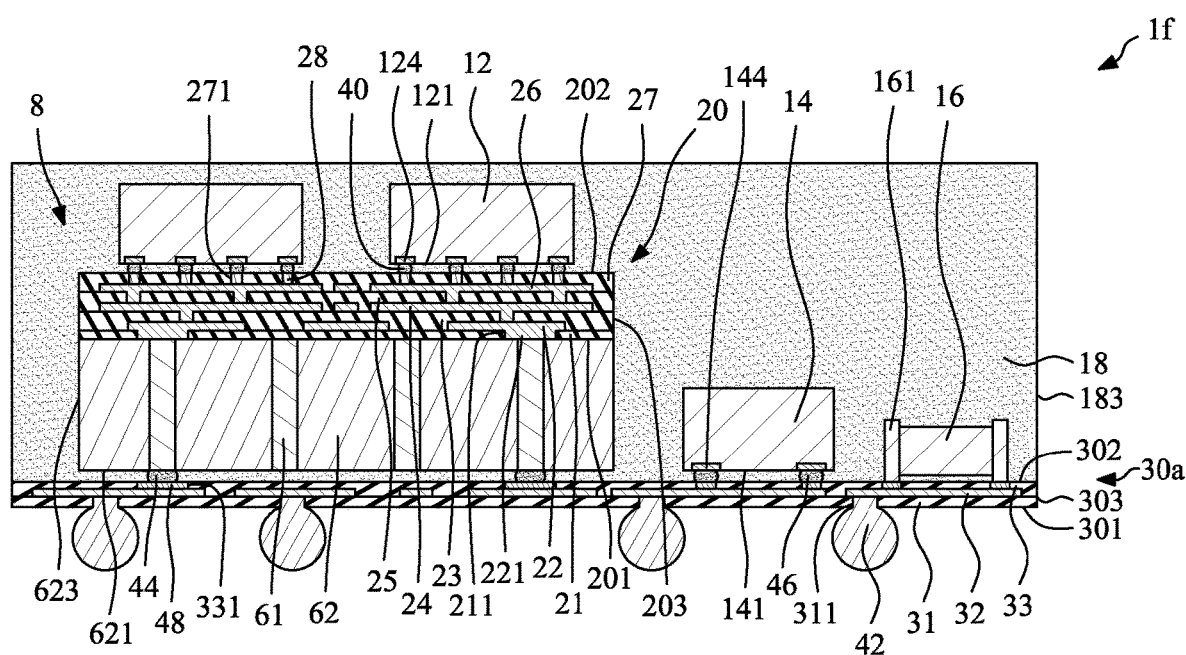
FIG. 7 illustrates a cross-sectional view of some embodiments of a semiconductor package structure according to an aspect of the present disclosure.

FIG. 7 illustrates a cross-sectional view of some embodiments of a semiconductor package structure 1f according to an aspect of the present disclosure. The semiconductor package structure 1f of FIG. 7 is similar to the semiconductor package structure 1e as shown in FIG. 6, except that the second conductive structure 30 of FIG. 6 is replaced by the second conductive structure 30a as shown in FIG. 3 and FIG. 5. The through vias 61 of the interposer 62 of the sub-package 8 are electrically connected to the second redistribution layer 32 of the second conductive structure 30a through the conductive bumps 44.

Figure 8:
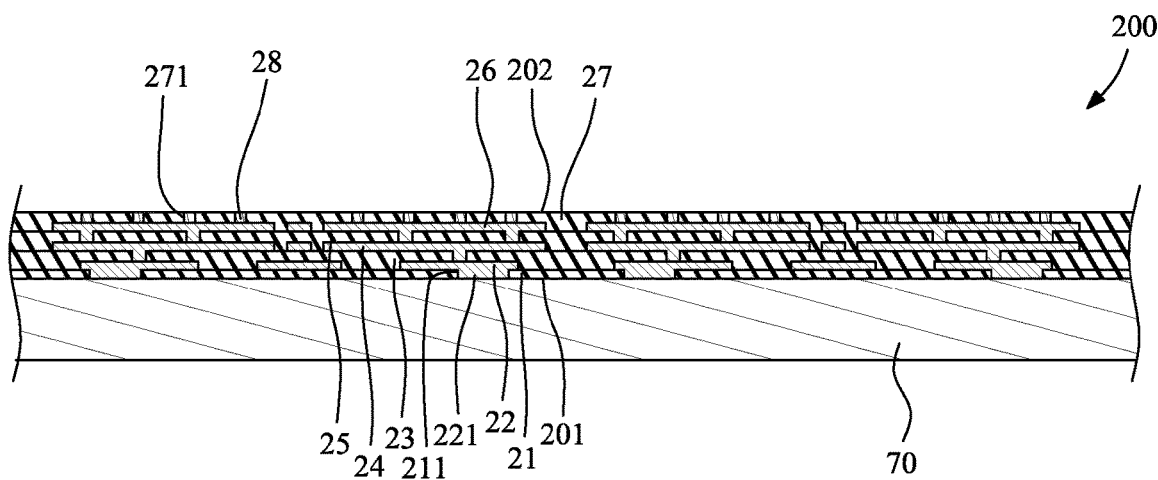
FIG. 8 illustrates one or more stages of some embodiments of a method for manufacturing a semiconductor package structure according to an aspect of the present disclosure.

FIG. 8 through FIG. 14 illustrate various stages of some embodiments of a method for manufacturing a semiconductor package structure according to an aspect of the present disclosure. In some embodiments, the method is for manufacturing a semiconductor package structure such as the semiconductor package structure 1 shown in FIG. 1. Referring to FIG. 8, a first carrier 70 is provided. The first carrier 70 may be, for example, a metal material, a ceramic material, a glass material, a substrate or a semiconductor wafer. The shape of the first carrier 70 may be, for example, substantially rectangular or square. Alternatively, the shape of the first carrier 70 may be, for example, substantially circular or elliptical.

Then, a base wiring structure 200 is formed or disposed on the first carrier 70. The base wiring structure 200 may include at least one first passivation layer and at least one first redistribution layer. For example, the base wiring structure 200 may include three first passivation layers and two first redistribution layers disposed therebetween, or the base wiring structure 200 may include four first passivation layers and three first redistribution layers disposed therebetween, for example. Other combinations of passivation layer(s) and redistribution layer(s) may also be implemented. As shown in FIG. 8, the base wiring structure 200 includes four first passivation layers (including, for example, a first bottom passivation layer 21, two first intermediate passivation layers 23, 25 and a first top passivation layer 27) and three first redistribution layers (including, for example, a first bottom redistribution layer 22, a first intermediate redistribution layer 24 and a first top redistribution layer 26) disposed therebetween.

The first bottom passivation layer 21 may define at least one through hole 211 extending through the first bottom passivation layer 21. The first bottom redistribution layer 22 is formed or disposed on the first bottom passivation layer 21 and embedded in the first intermediate passivation layer 23. In some embodiments, as shown in FIG. 8, the first bottom redistribution layer 22 may include at least one extending portion 221 disposed in the through hole 211 of the first bottom passivation layer 21. The extending portion 221 of the first bottom redistribution layer 22 is exposed from the bottom surface of the first bottom passivation layer 21.

The first intermediate passivation layer 23 is formed or disposed on the first bottom passivation layer 21, and covers the first bottom redistribution layer 22. The first intermediate redistribution layer 24 is formed or disposed on the first intermediate passivation layer 23, and is electrically connected to the first bottom redistribution layer 22. The first intermediate passivation layer 25 is formed or disposed on the first intermediate passivation layer 23, and covers the first intermediate redistribution layer 24. The first top redistribution layer 26 is formed or disposed on the first intermediate passivation layer 25, and is electrically connected to the first intermediate redistribution layer 24. The first top passivation layer 27 is formed or disposed on the first intermediate passivation layer 25, and covers the first top redistribution layer 26. The first top passivation layer 27 may define a plurality of through holes 271 extending through the first top passivation layer 27 to expose portions of the first top redistribution layer 26. A plurality of conductive materials 28 (e.g., pre-solder materials) may be disposed in the respective ones of the through holes 271 of the first top passivation layer 27 to contact the first top redistribution layer 26. In one or more embodiments, a line width/line space (L/S) of the first redistribution layers (including, for example, the first bottom redistribution layer 22, the first intermediate redistribution layer 24 and the first top redistribution layer 26) of the base wiring structure 200 may be equal to or less than about 2 µm/about 2 µm (such as, for example, about 1.8 µm/about 1.8 µm or less, about 1.6 µm/about 1.6 µm or less, or about 1.4 µm/about 1.4 µm or less).

Figure 9:
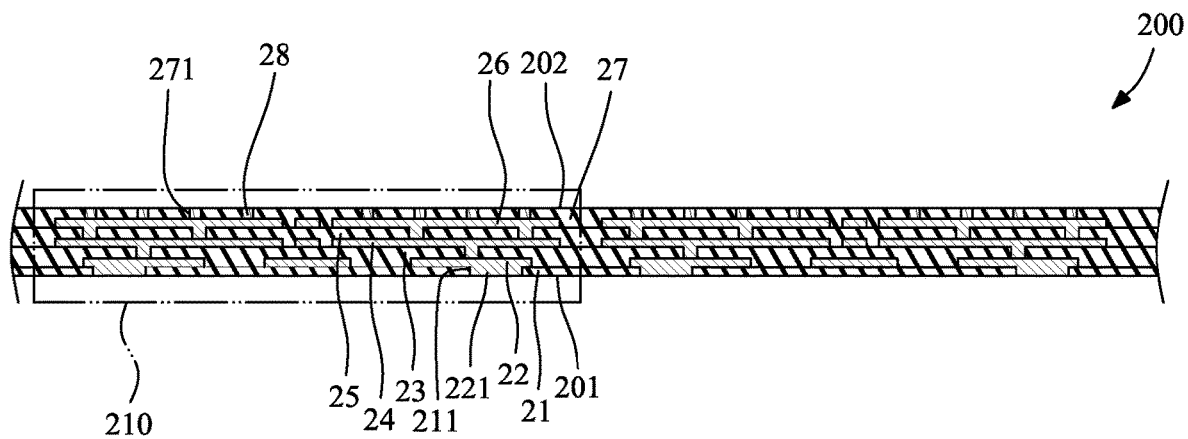
FIG. 9 illustrates one or more stages of some embodiments of a method for manufacturing a semiconductor package structure according to an aspect of the present disclosure.

Referring to FIG. 9, the first carrier 70 is removed. The base wiring structure 200 may include a plurality of wiring units 210. Then, one or more of the wiring units 210 of the base wiring structure 200 are tested and marked. For example, an OS test (open short test) may be conducted on the wiring units 210. As a result, the wiring units 210 that pass the test may be marked as known good wiring units, and the wiring units 210 that fail the test may be marked as known bad wiring units, or may be discarded or otherwise disposed of.

Figure 10:
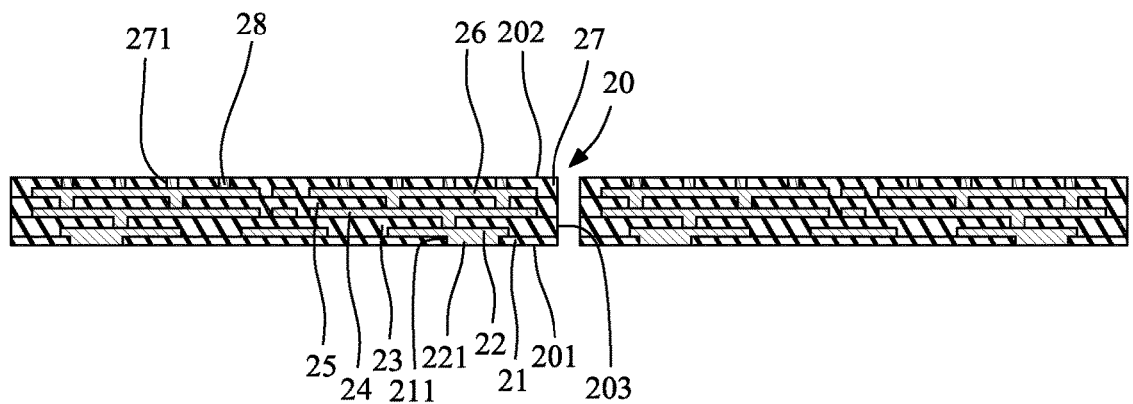
FIG. 10 illustrates one or more stages of some embodiments of a method for manufacturing a semiconductor package structure according to an aspect of the present disclosure.

Referring to FIG. 10, the base wiring structure 200 is singulated to form a plurality of first conductive structures 20. The first conductive structures 20 correspond to t the wiring units 210. Therefore, the first conductive structures 20 may include a plurality of known good first conductive structures 20 and a plurality of known bad first conductive structures 20.

Figure 11:
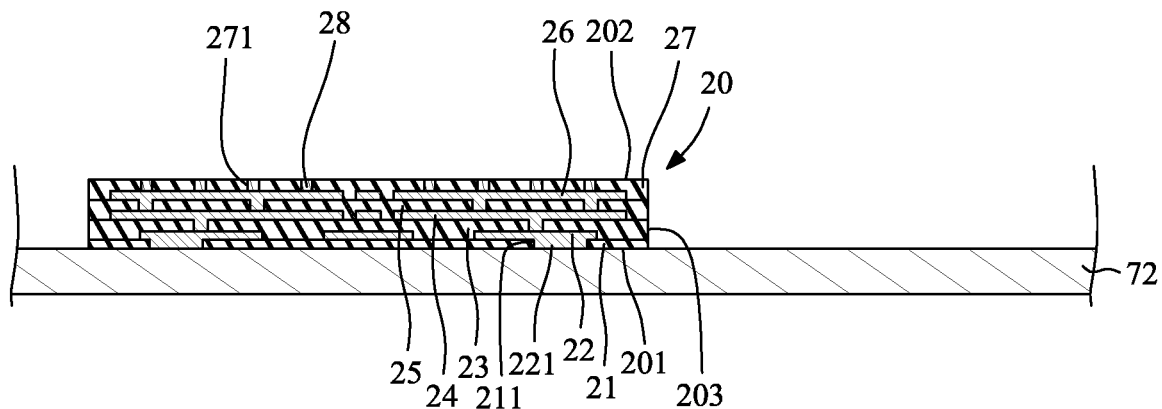
FIG. 11 illustrates one or more stages of some embodiments of a method for manufacturing a semiconductor package structure according to an aspect of the present disclosure.

Referring to FIG. 11, the known good first conductive structures 20 are disposed or attached on a second carrier 72. The known good first conductive structures 20 are reconstituted or rearranged on the second carrier 72, and the known bad first conductive structures 20 may be disregarded for purposes of this description. Subsequent reference to a "first conductive structure 20" in the presently described process refers to a known good first conductive structure 20. It is noted that a material and a size of the second carrier 72 may be same as or different from a material and a size of the first carrier 70.

Figure 12:
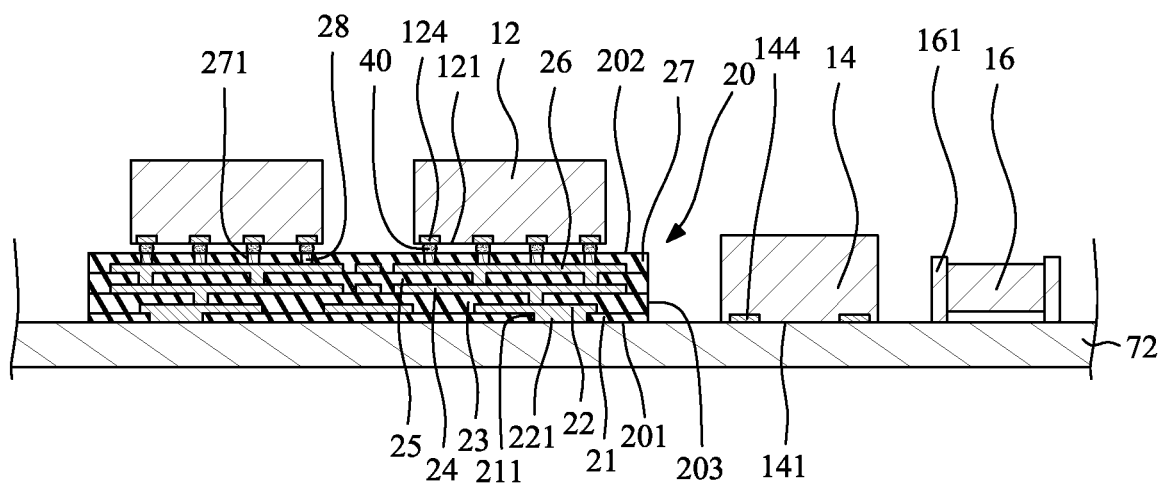
FIG. 12 illustrates one or more stages of some embodiments of a method for manufacturing a semiconductor package structure according to an aspect of the present disclosure.

Referring to FIG. 12, at least one first semiconductor component (including, for example, at least one high-end semiconductor die 12) is disposed on one of the first conductive structures 20. In one or more embodiments, the first semiconductor component (including, for example, at least one high-end semiconductor die 12) may include a plurality of conductive bumps 40 and a plurality of bump pads 124 disposed adjacent to the active surface 121 thereof. One end of each of the respective conductive bumps 40 contacts the bump pad 124 of the first semiconductor component (including, for example, at least one high-end semiconductor die 12), and the other end of each of the respective conductive bumps 40 contacts a respective one of the conductive materials 28 (e.g., pre-solder materials) in the respective ones of the through holes 271 of the first top passivation layer 27 so that the first semiconductor component (including, for example, at least one high-end semiconductor die 12) is electrically connected to the first top redistribution layer 26 of the first conductive structure 20 through the conductive bumps 40. That is, the first semiconductor component (including, for example, at least one high-end semiconductor die 12) is attached to the first conductive structure 20 by flip chip bonding. An underfill may be further included in a space between the active surface 121 of the first semiconductor component (including, for example, at least one high-end semiconductor die 12) and the second surface 202 of the first conductive structure 20 to cover and protect the conductive bumps 40.

Then, at least one second semiconductor component (including, for example, a low-end semiconductor die 14 and a passive element 16, e.g., an MLCC) is disposed on the second carrier 72. The low-end semiconductor die 14 may have an active surface 141 and include a plurality of bumps pads 144 disposed adjacent to the active surface 141. The active surface 141 of the low-end semiconductor die 14 is attached to the second carrier 72. The passive element 16 may include at least one electrode 161 disposed on the second carrier 72.

Figure 13:
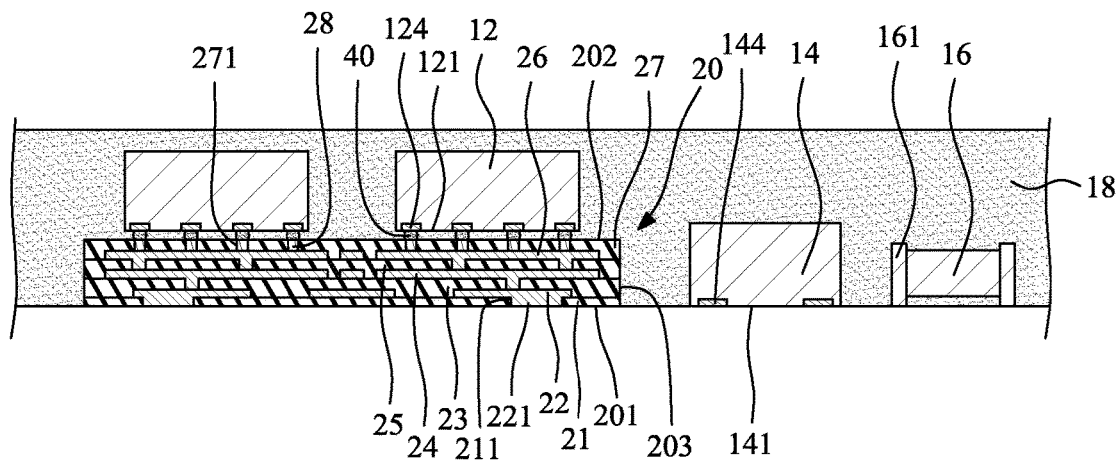
FIG. 13 illustrates one or more stages of some embodiments of a method for manufacturing a semiconductor package structure according to an aspect of the present disclosure.

Referring to FIG. 13, a first encapsulant 18, for example, a molding compound, is formed to cover the first semiconductor component (including, for example, at least one high-end semiconductor die 12), the first conductive structure 20, the second semiconductor component (including, for example, the low-end semiconductor die 14 and the passive element 16, e.g., an MLCC) and the second carrier 72. As shown in FIG. 13, the first encapsulant 18 further covers the lateral surface 203 of the first conductive structure 20.

Then, the second carrier 72 is removed.

Figure 14:
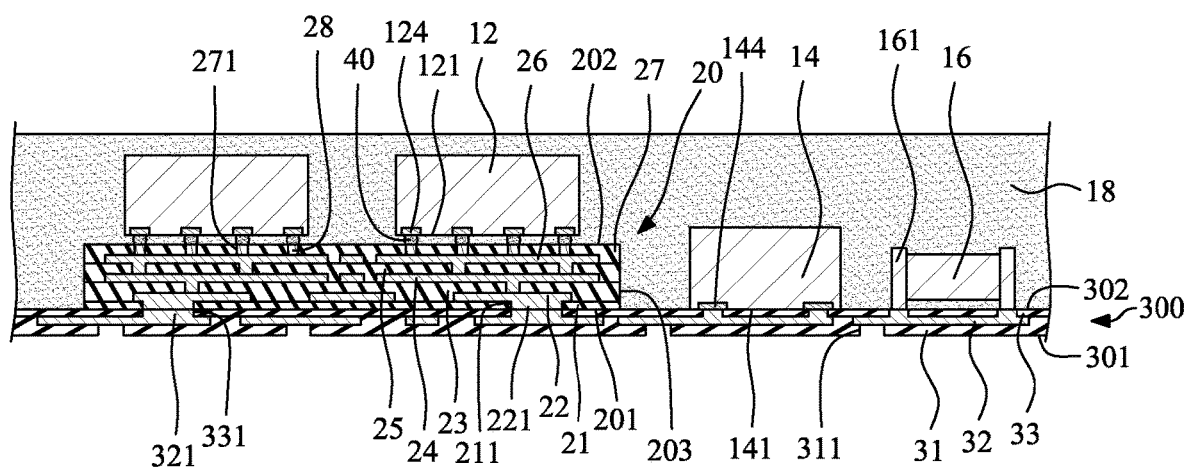
FIG. 14 illustrates one or more stages of some embodiments of a method for manufacturing a semiconductor package structure according to an aspect of the present disclosure.

Referring to FIG. 14, an outer wiring structure 300 is formed or disposed on the first conductive structure 20, the first encapsulant 18 and the second semiconductor component (including, for example, the low-end semiconductor die 14 and the passive element 16, e.g., an MLCC) directly. The outer wiring structure 300 may include at least one second passivation layer and at least one second redistribution layer. For example, the outer wiring structure 300 may include three second passivation layers and two second redistribution layers disposed therebetween, or the outer wiring structure 300 may include two second passivation layers and a second redistribution layer disposed therebetween, for example. Other combinations of passivation layer(s) and redistribution layer(s) may also be implemented. As shown in FIG. 14, the outer wiring structure 300 includes two second passivation layers (including, for example, a second bottom passivation layer 31 and a second top passivation layer 33) and a second redistribution layers 32 disposed therebetween.

The second top passivation layer 33 may define at least one through hole 331 extending through the second top passivation layer 33. The second redistribution layer 32 is disposed on the second top passivation layer 33 and embedded in the second bottom passivation layer 31. In some embodiments, the second redistribution layer 32 may include at least one extending portion 321 disposed in the through hole 331 of the second top passivation layer 33. The extending portion 321 of the second redistribution layer 32 is exposed from the top surface of the second top passivation layer 33. The second bottom passivation layer 31 is disposed on the second top passivation layer 33, and covers the second redistribution layer 32. The second bottom passivation layer 31 may define a plurality of through holes 311 extending through the second bottom passivation layer 31 to expose portions of the second redistribution layer 32. In one or more embodiments, a line width and a line space (L/S) of the first redistribution layers (including, for example, the first bottom redistribution layer 22, the first intermediate redistribution layer 24 and the first top redistribution layer 26) of the first conductive structure 20 is smaller than a line width and a line space (L/S) of the second redistribution layer 32 of the outer wiring structure 300. For example, a line width/line space (L/S) of the second redistribution layer 32 of the outer wiring structure 300 may be greater than about 5 µm/about 5 µm, or greater than about 7 µm/about 7 µm.

As shown in FIG. 14, the top surface of the outer wiring structure 300 contacts the first surface 201 of the first conductive structure 20 directly, and the extending portion 321 of the second redistribution layer 32 contacts the extending portion 221 of the first bottom redistribution layer 22. Therefore, the first bottom redistribution layer 22 of the first conductive structure 20 is electrically connected to the second redistribution layer 32 of the second outer wiring structure 300 through the extending portion 221 and the extending portion 321. In addition, the top surface of the outer wiring structure 300 may contact the active surface 141 of the low-end semiconductor die 14 directly, and some of the extending portions 321 of the second redistribution layer 32 may contact the bumps pads 144 of the low-end semiconductor die 14. Further, some of the extending portions 321 of the second redistribution layer 32 may contact the electrode 161 of the passive element 16.

Then, the outer wiring structure 300 and the first encapsulant 18 are singulated to form a plurality of semiconductor package structures 1 shown in FIG. 1. The outer wiring structure 300 is cut to form a plurality of second conductive structures 30. In some embodiments, a plurality of external connectors 42 (e.g., solder bumps) may be disposed in the respective ones of the through holes 311 of the second bottom passivation layer 31 to contact the second redistribution layer 32 for external connection. In addition, the lateral surface 183 of the first encapsulant 18 is substantially coplanar with the lateral surface 303 of the second conductive structure 30 since the first encapsulant 18 and the second conductive structure 30 are cut concurrently at a stage. Further, the first conductive structure 20 and the first encapsulant 18 are not cut concurrently at a stage, so that the lateral surface 203 of the first conductive structure 20 is not coplanar with the lateral surface 183 of the first encapsulant 18.

Figure 15:
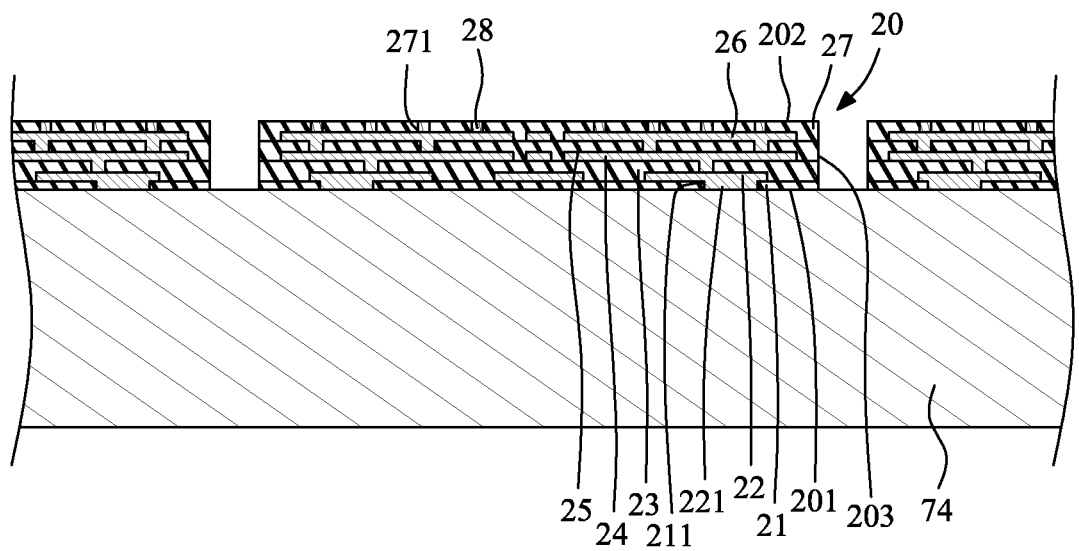
FIG. 15 illustrates one or more stages of some embodiments of a method for manufacturing a semiconductor package structure according to an aspect of the present disclosure.

FIG. 15 through FIG. 22 illustrate various stages of some embodiments of a method for manufacturing a semiconductor package structure according to an aspect of the present disclosure. In some embodiments, the method is for manufacturing a semiconductor package structure such as the semiconductor package structure 1a shown in FIG. 2. The initial stages of the illustrated process are the same as, or similar to, the stages illustrated in FIG. 8 through FIG. 10. FIG. 15 depicts a stage subsequent to that depicted in FIG. 10. Referring to FIG. 15, the known good first conductive structures 20 are disposed or attached on a second carrier 74. The known good first conductive structures 20 are reconstituted or rearranged on the second carrier 74. It is noted that a material and a size of the second carrier 74 of FIG. 15 may be same as or different from a material and a size of the second carrier 72 of FIG. 11.

Figure 16:
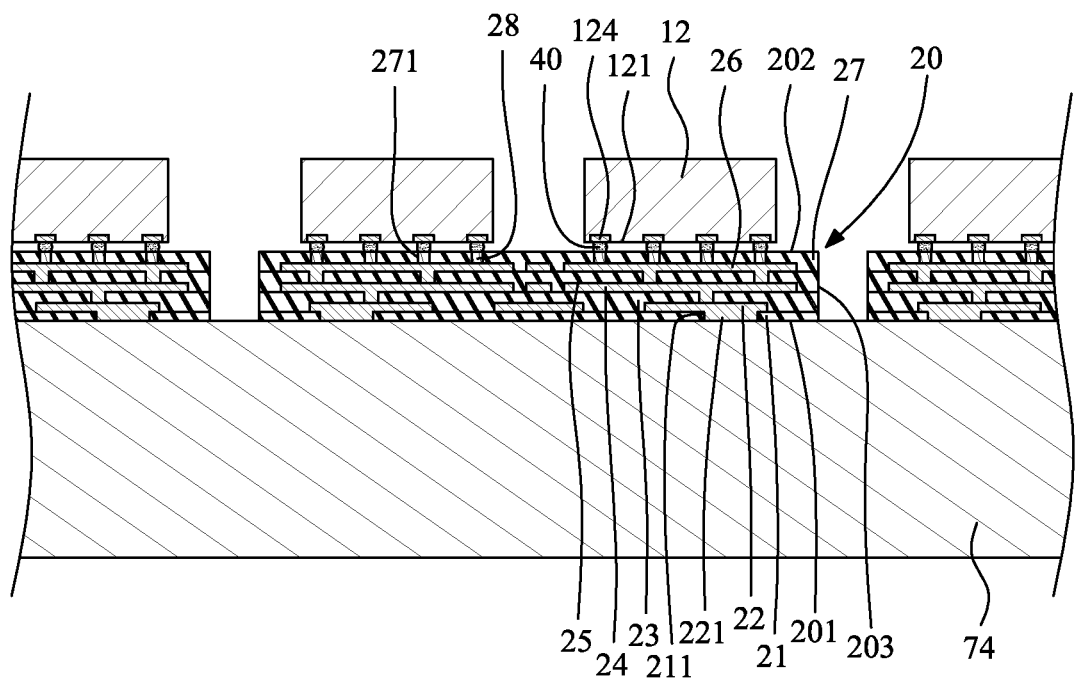
FIG. 16 illustrates one or more stages of some embodiments of a method for manufacturing a semiconductor package structure according to an aspect of the present disclosure.

Referring to FIG. 16, at least one first semiconductor component (including, for example, at least one high-end semiconductor die 12) is disposed on a respective one of the first conductive structures 20. In one or more embodiments, the first semiconductor component (including, for example, at least one high-end semiconductor die 12) is electrically connected to the first top redistribution layer 26 of the first conductive structure 20 through the conductive bumps 40. That is, the first semiconductor component (including, for example, at least one high-end semiconductor die 12) is attached to the first conductive structure 20 by flip chip bonding.

Figure 17:
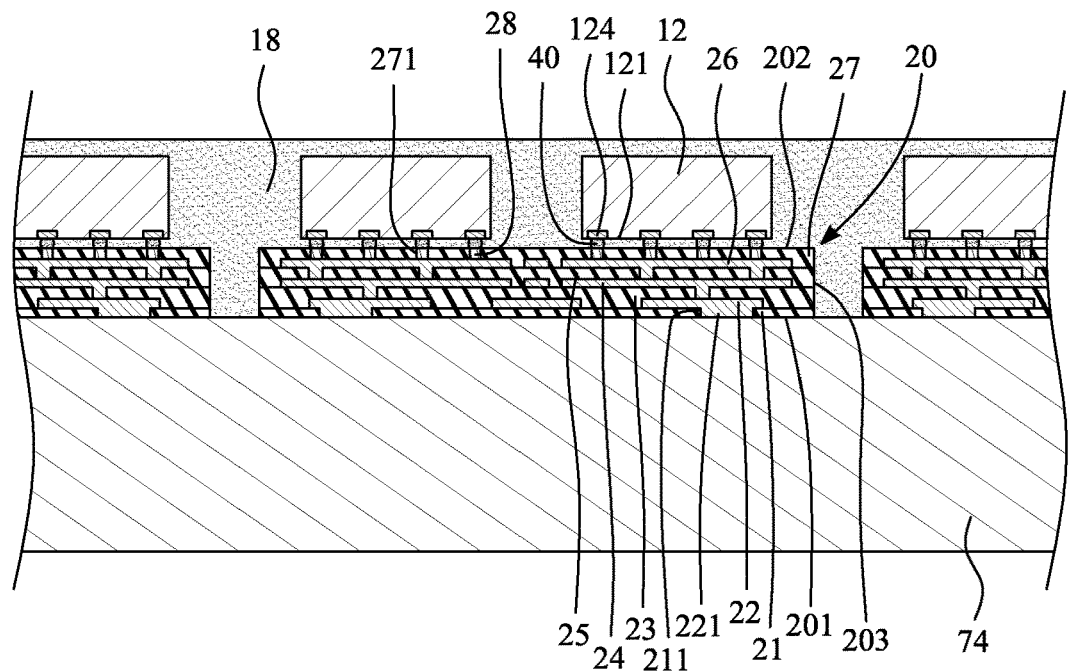
FIG. 17 illustrates one or more stages of some embodiments of a method for manufacturing a semiconductor package structure according to an aspect of the present disclosure.

Referring to FIG. 17, a first encapsulant 18, for example, a molding compound, is formed to cover the first semiconductor component (including, for example, at least one high-end semiconductor die 12), the first conductive structure 20 and the second carrier 74.

Figure 18:
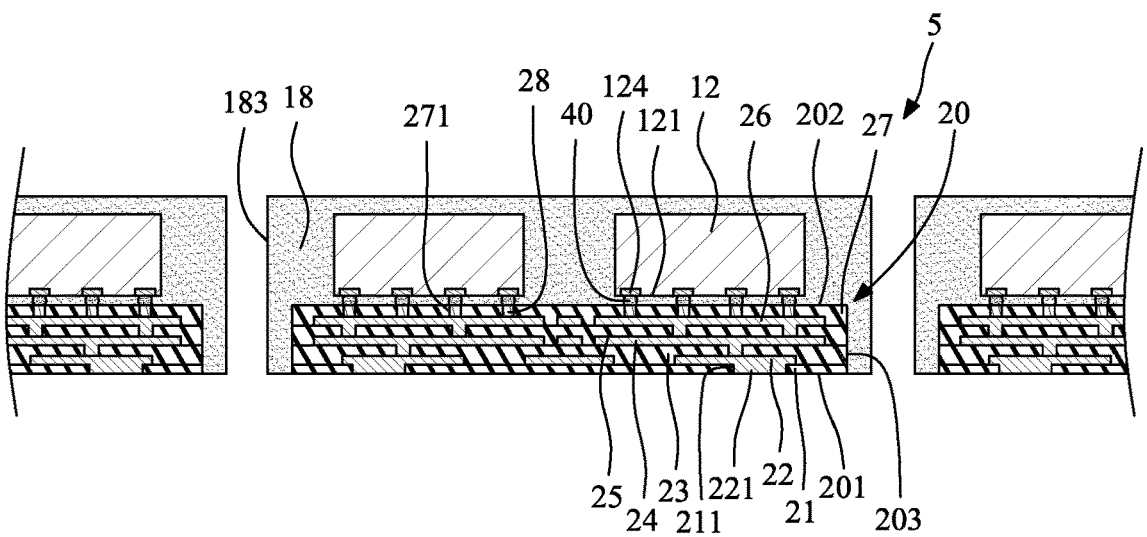
FIG. 18 illustrates one or more stages of some embodiments of a method for manufacturing a semiconductor package structure according to an aspect of the present disclosure.

Referring to FIG. 18, the second carrier 74 is removed. Then, the first encapsulant 18 is singulated to form a plurality of unit packages 5. The unit package 5 includes a first conductive structure 20, the first semiconductor component (including, for example, at least one high-end semiconductor die 12) and the first encapsulant 18. The first encapsulant 18 covers the lateral surface 203 of the first conductive structure 20.

Figure 19:
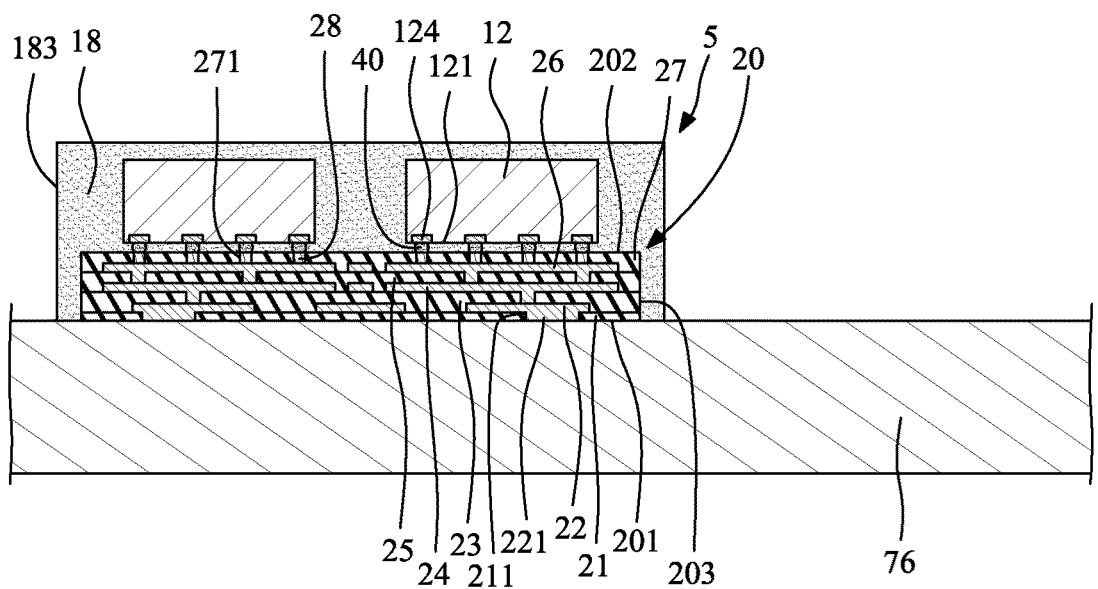
FIG. 19 illustrates one or more stages of some embodiments of a method for manufacturing a semiconductor package structure according to an aspect of the present disclosure.

Referring to FIG. 19, the unit packages 5 are disposed or attached on a third carrier 76. It is noted that a material and a size of the third carrier 76 of FIG. 19 may be same as or different from a material and a size of the second carrier 74 of FIG. 15.

Figure 20:
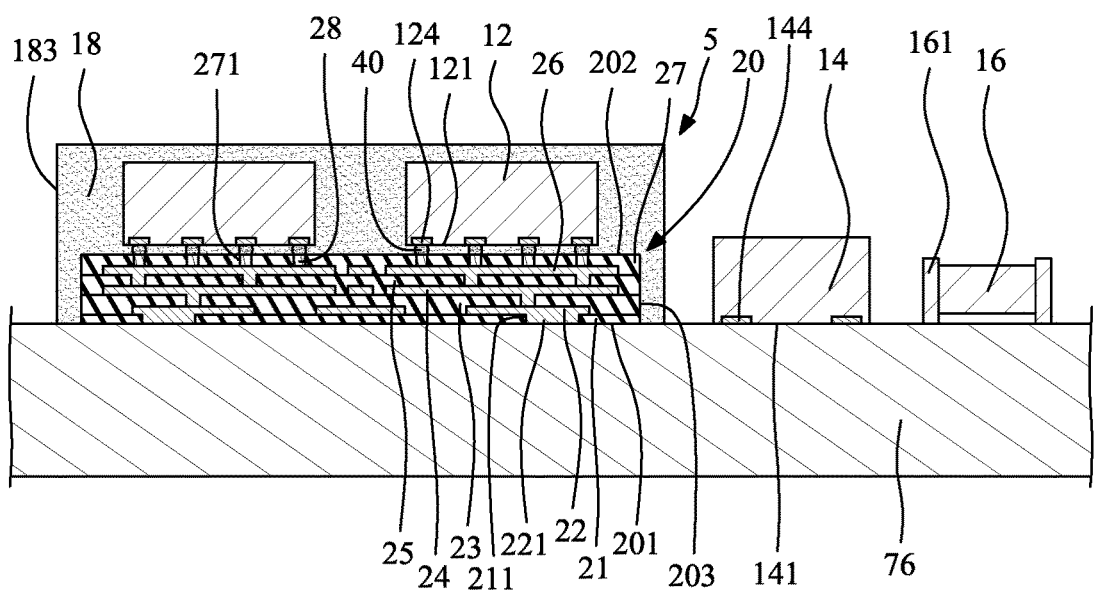
FIG. 20 illustrates one or more stages of some embodiments of a method for manufacturing a semiconductor package structure according to an aspect of the present disclosure.

Referring to FIG. 20, at least one second semiconductor component (including, for example, a low-end semiconductor die 14 and a passive element 16, e.g., an MLCC) is disposed on the third carrier 76. The low-end semiconductor die 14 may have an active surface 141 and include a plurality of bumps pads 144 disposed adjacent to the active surface 141. The active surface 141 of the low-end semiconductor die 14 is attached to the third carrier 76. The passive element 16 may include at least one electrode 161 disposed on the third carrier 76.

Figure 21:
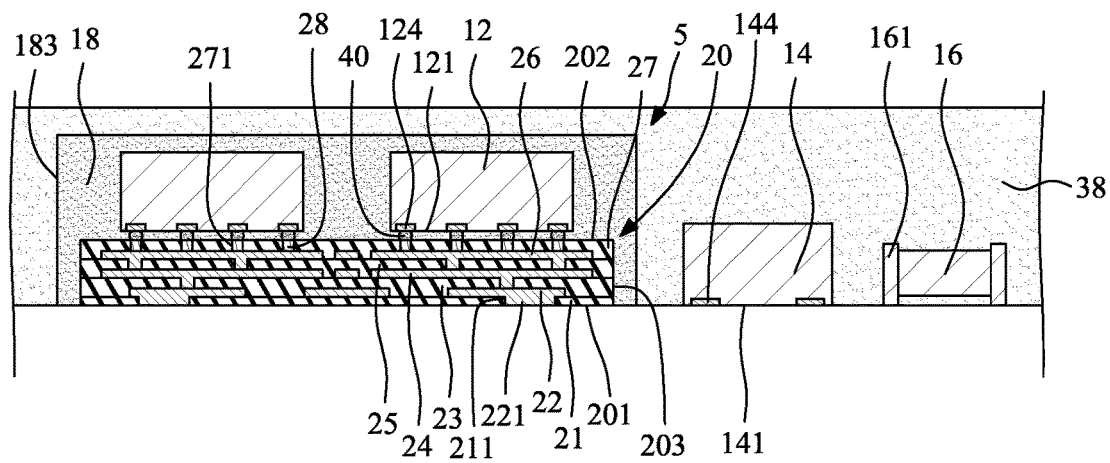
FIG. 21 illustrates one or more stages of some embodiments of a method for manufacturing a semiconductor package structure according to an aspect of the present disclosure.

Referring to FIG. 21, a second encapsulant 38, for example, a molding compound, is formed to cover the unit package 5, the second semiconductor component (including, for example, a low-end semiconductor die 14 and a passive element 16, e.g., an MLCC) and the third carrier 76. Then, the third carrier 76 is removed.

Figure 22:
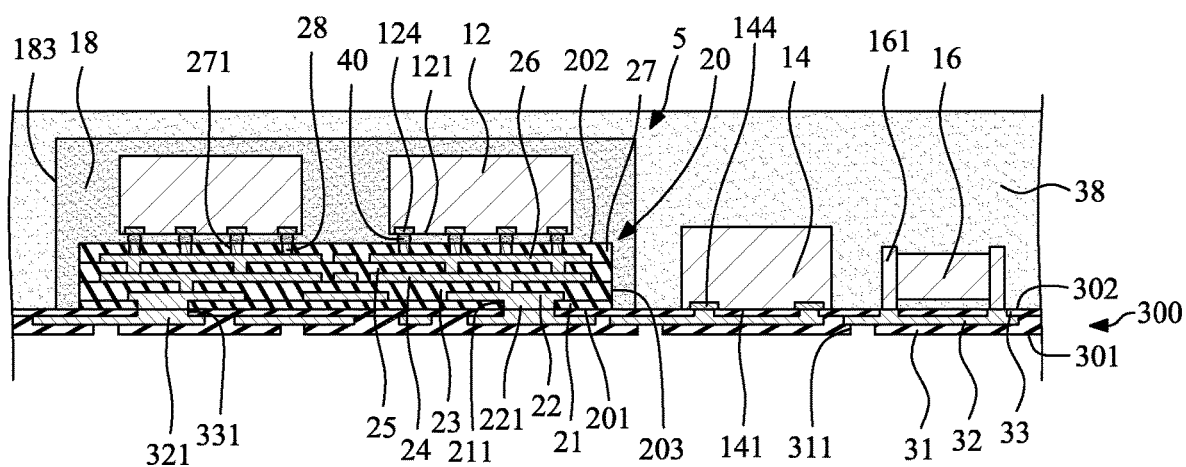
FIG. 22 illustrates one or more stages of some embodiments of a method for manufacturing a semiconductor package structure according to an aspect of the present disclosure.

Referring to FIG. 22, an outer wiring structure 300 is formed or disposed on the first conductive structure 20 of the unit package 5, the first encapsulant 18, the second semiconductor component (including, for example, the low-end semiconductor die 14 and the passive element 16, e.g., an MLCC) and the second encapsulant 38 directly. The outer wiring structure 300 of FIG. 22 may be same as the outer wiring structure 300 of FIG. 14.

Then, the outer wiring structure 300 and the second encapsulant 38 are singulated to form a plurality of semiconductor package structures 1a shown in FIG. 2. Meanwhile, the outer wiring structure 300 is cut to form a plurality of second conductive structures 30. In some embodiments, a plurality of external connectors 42 (e.g., solder bumps) may be disposed in the respective ones of the through holes 311 of the second bottom passivation layer 31 to contact the second redistribution layer 32 for external connection. In addition, the lateral surface 383 of the second encapsulant 38 is substantially coplanar with the lateral surface 303 of the second conductive structure 30 since the second encapsulant 38 and the second conductive structure 30 are cut concurrently at a stage.

Figure 23:
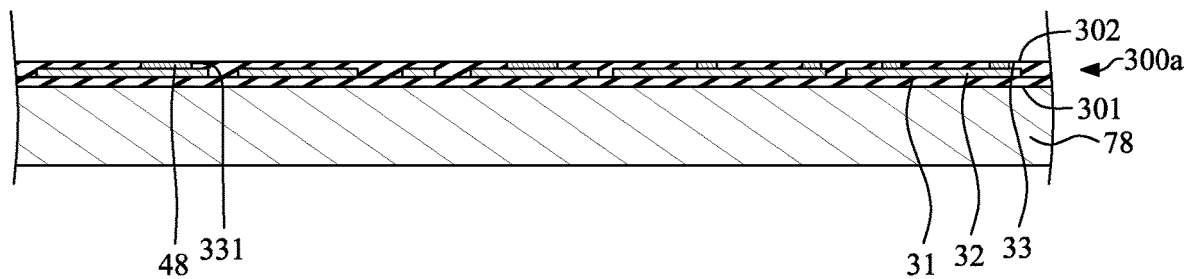
FIG. 23 illustrates one or more stages of some embodiments of a method for manufacturing a semiconductor package structure according to an aspect of the present disclosure.

FIG. 23 through FIG. 27 illustrate various stages of some embodiments of a method for manufacturing a semiconductor package structure according to an aspect of the present disclosure. In some embodiments, the method is for manufacturing a semiconductor package structure such as the semiconductor package structure 1b shown in FIG. 3. The initial stages of the illustrated process are the same as, or similar to, the stages illustrated in FIG. 15 through FIG. 18. FIG. 23 depicts a stage subsequent to that depicted in FIG. 18. Referring to FIG. 23, an outer wiring structure 300a is formed or disposed on a fourth carrier 78. In the outer wiring structure 300a, the second redistribution layer 32 is disposed on the second bottom passivation layer 31 and embedded in the second top passivation layer 33. As shown in FIG. 23, the second top passivation layer 33 may define a plurality of through holes 331 extending through the second top passivation layer 33 to expose portions of the second redistribution layer 32. A plurality of conductive materials 48 (e.g., pre-solder materials) may be disposed in the respective ones of the through holes 331 of the second top passivation layer 33 to contact the second redistribution layer 32.

Figure 24:
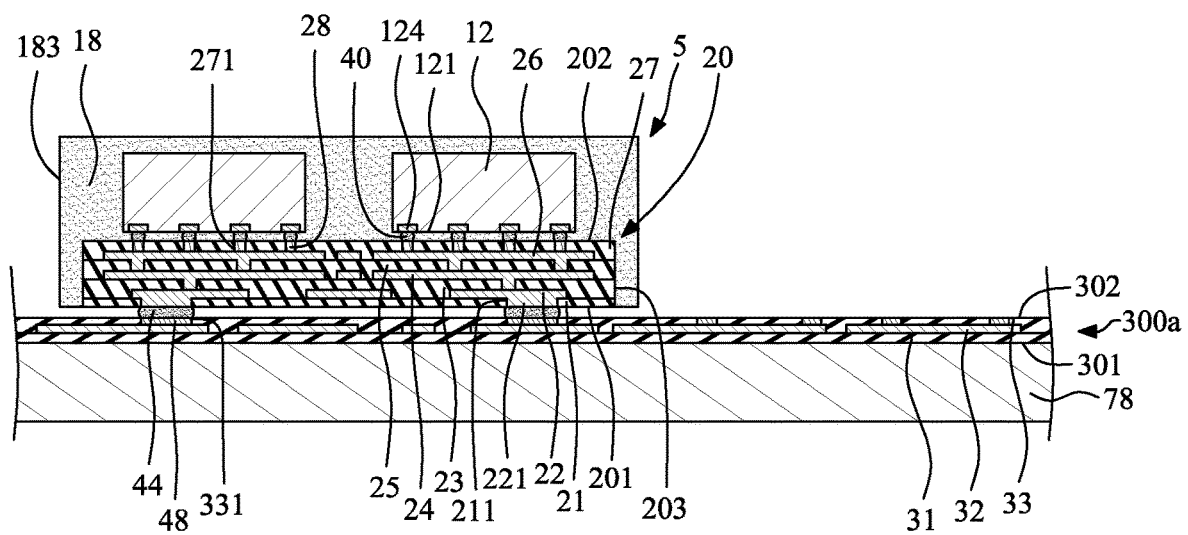
FIG. 24 illustrates one or more stages of some embodiments of a method for manufacturing a semiconductor package structure according to an aspect of the present disclosure.

Referring to FIG. 24, the unit package 5 is attached to the outer wiring structure 300a through a plurality of conductive bumps 44. One end of at least some of the conductive bumps 44 contacts the extending portion 221 of the first bottom redistribution layer 22 of the unit package 5, and the other respective end of the at least some conductive bumps 44 contacts a respective one of the conductive materials 48 (e.g., pre-solder materials) in the respective ones of the through holes 331 of the second top passivation layer 33 so that the unit package 5 is electrically connected to the second redistribution layer 32 of the outer wiring structure 300a through the conductive bumps 44. An underfill may be further included in a space between the bottom surface of the unit package 5 and the second surface 302 of the outer wiring structure 300a to cover and protect the conductive bumps 44.

Figure 25:
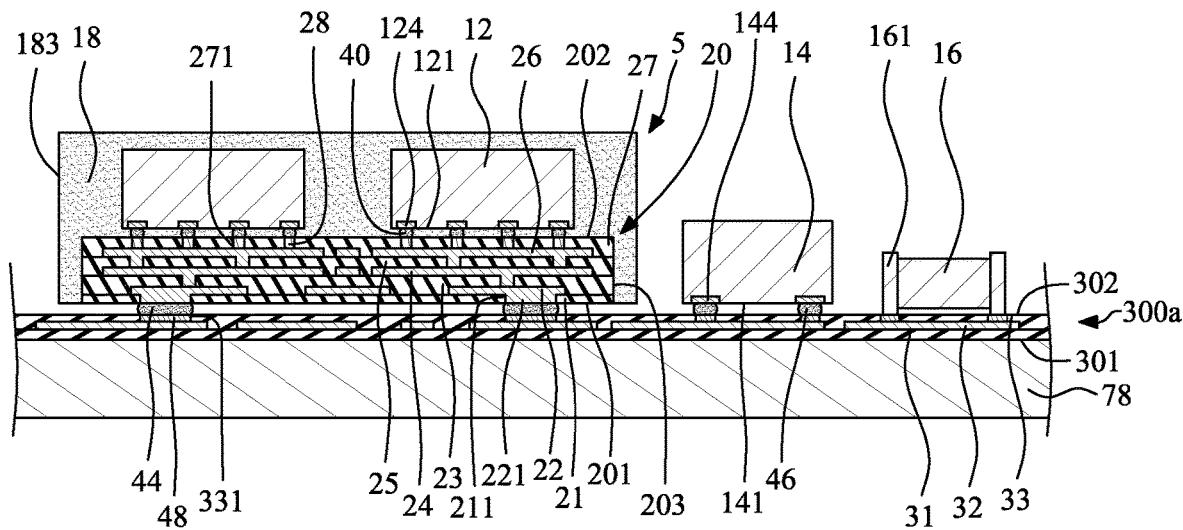
FIG. 25 illustrates one or more stages of some embodiments of a method for manufacturing a semiconductor package structure according to an aspect of the present disclosure.

Referring to FIG. 25, the second semiconductor component (including, for example, the low-end semiconductor die 14 and the passive element 16, e.g., an MLCC) may be attached to the second surface 302 of the outer wiring structure 300a through the conductive bumps 44 by flip chip bonding.

Figure 26:
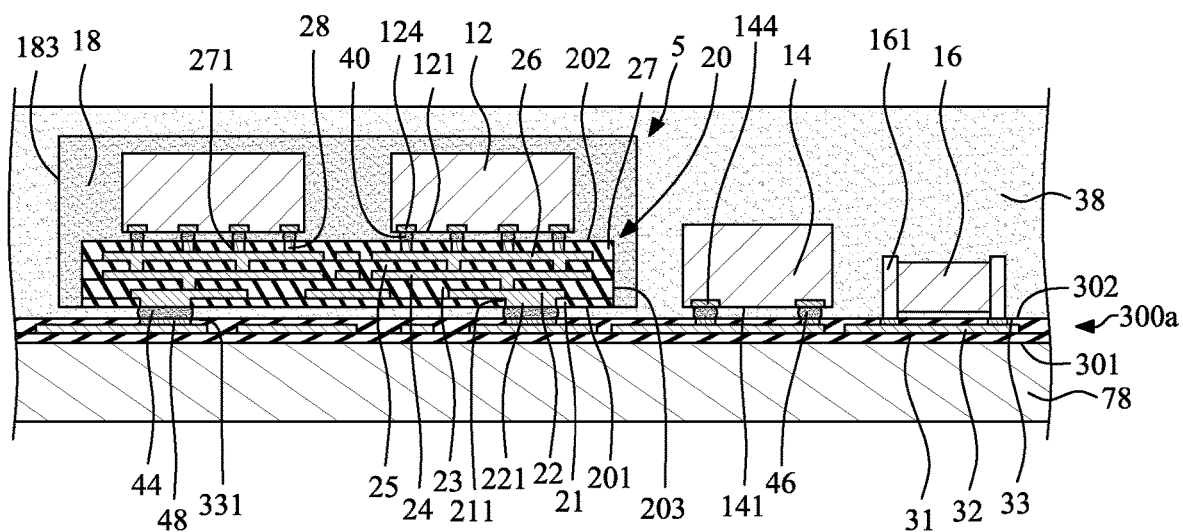
FIG. 26 illustrates one or more stages of some embodiments of a method for manufacturing a semiconductor package structure according to an aspect of the present disclosure.

Referring to FIG. 26, a second encapsulant 38, for example, a molding compound, is formed to cover the unit packages 5, the second semiconductor component (including, for example, a low-end semiconductor die 14 and a passive element 16, e.g., an MLCC) and the fourth carrier 78.

Figure 27:
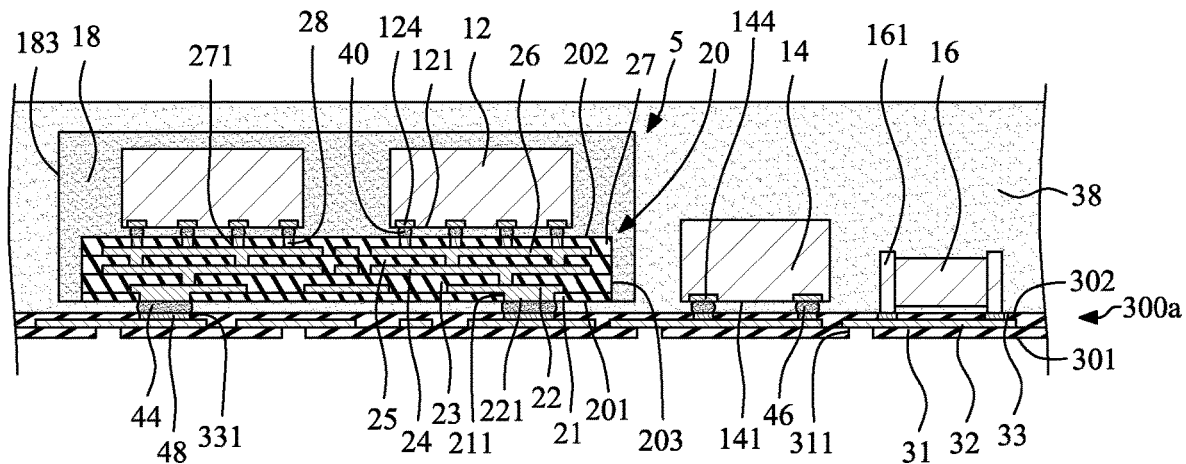
FIG. 27 illustrates one or more stages of some embodiments of a method for manufacturing a semiconductor package structure according to an aspect of the present disclosure.

Referring to FIG. 27, the fourth carrier 78 is removed. Then, a plurality of through holes 311 are formed in the second bottom passivation layer 31 of the outer wiring structure 300a to extend through the second bottom passivation layer 31 to expose portions of the second redistribution layer 32.

Then, the outer wiring structure 300a and the second encapsulant 38 are singulated to form a plurality of semiconductor package structures 1b shown in FIG. 3. Meanwhile, the outer wiring structure 300a is cut to form a plurality of second conductive structures 30a. In some embodiments, a plurality of external connectors 42 (e.g., solder bumps) may be disposed in the respective ones of the through holes 311 of the second bottom passivation layer 31 to contact the second redistribution layer 32 for external connection. In addition, the lateral surface 383 of the second encapsulant 38 is substantially coplanar with the lateral surface 303 of the second conductive structure 30a since the second encapsulant 38 and the second conductive structure 30a are cut concurrently at a stage.

Figure 28:
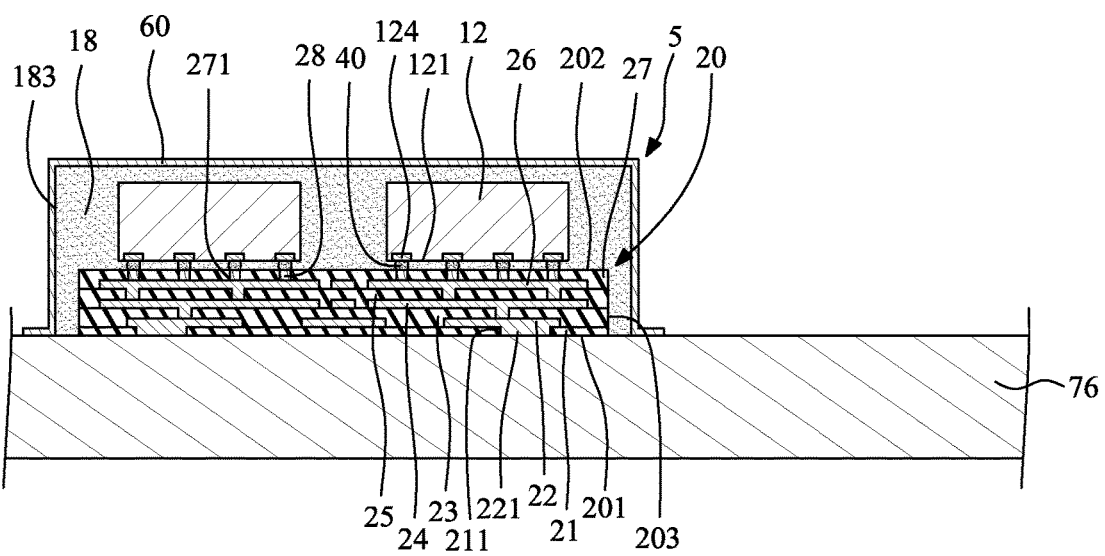
FIG. 28 illustrates one or more stages of some embodiments of a method for manufacturing a semiconductor package structure according to an aspect of the present disclosure.

FIG. 28 through FIG. 31 illustrate various stages of some embodiments of a method for manufacturing a semiconductor package structure according to an aspect of the present disclosure. In some embodiments, the method is for manufacturing a semiconductor package structure such as the semiconductor package structure 1c shown in FIG. 4. The initial stages of the illustrated process are the same as, or similar to, the stages illustrated in FIG. 15 through FIG. 19. FIG. 28 depicts a stage subsequent to that depicted in FIG. 19. Referring to FIG. 28, a shielding layer 60 is formed to cover the unit package 5. In some embodiments, the shielding layer 60 may further extend to contact the third carrier 76.

Figure 29:
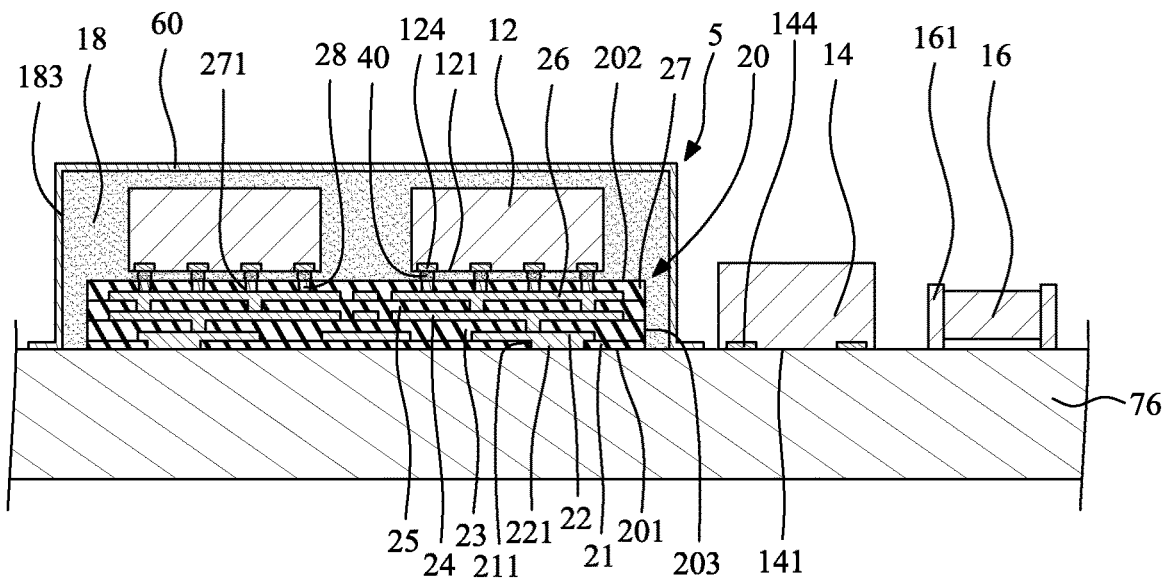
FIG. 29 illustrates one or more stages of some embodiments of a method for manufacturing a semiconductor package structure according to an aspect of the present disclosure.

Referring to FIG. 29, the second semiconductor component (including, for example, a low-end semiconductor die 14 and a passive element 16, e.g., an MLCC) is disposed on the third carrier 76.

Figure 30:
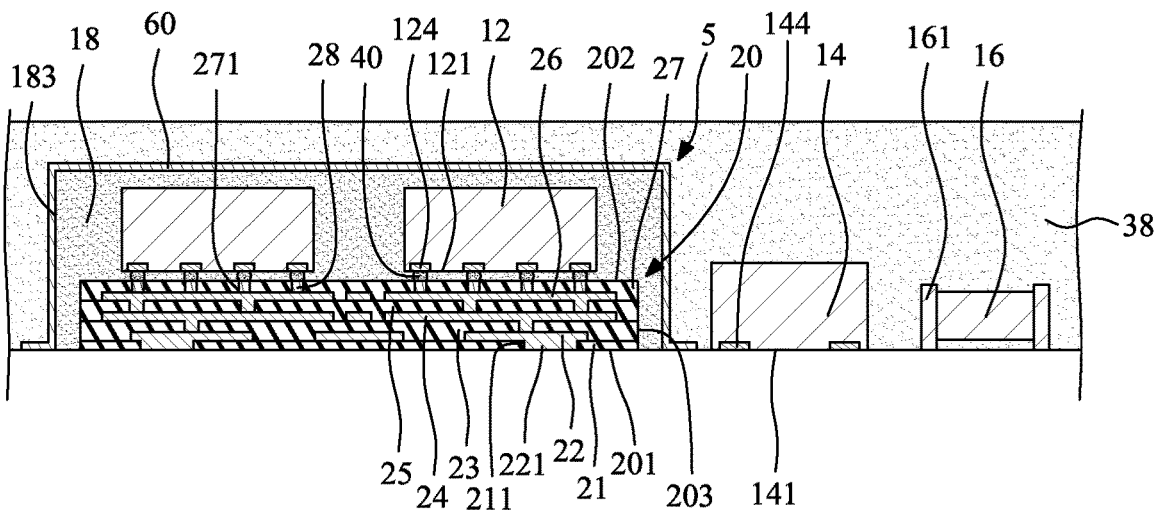
FIG. 30 illustrates one or more stages of some embodiments of a method for manufacturing a semiconductor package structure according to an aspect of the present disclosure.

Referring to FIG. 30, a second encapsulant 38, for example, a molding compound, is formed to cover the shielding layer 60 of the unit package 5, the second semiconductor component (including, for example, a low-end semiconductor die 14 and a passive element 16, e.g., an MLCC) and the third carrier 76. Then, the third carrier 76 is removed.

Figure 31:
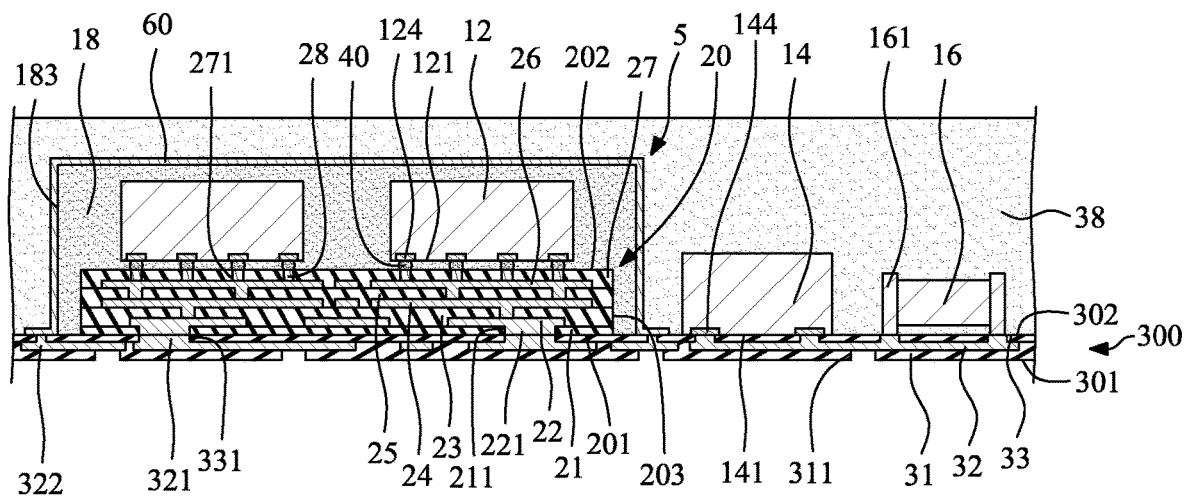
FIG. 31 illustrates one or more stages of some embodiments of a method for manufacturing a semiconductor package structure according to an aspect of the present disclosure.

Referring to FIG. 31, an outer wiring structure 300 is formed or disposed on the first conductive structure 20 of the unit package 5, the first encapsulant 18, the second semiconductor component (including, for example, the low-end semiconductor die 14 and the passive element 16, e.g., an MLCC) and the second encapsulant 38 directly. The outer wiring structure 300 of FIG. 31 may be same as the outer wiring structure 300 of FIG. 14. In addition, the shielding layer 60 of the unit package 5 may be electrically connected to the ground pad 322 of the second redistribution layer 32 of the outer wiring structure 300.

Then, the outer wiring structure 300 and the second encapsulant 38 are singulated to form a plurality of semiconductor package structures 1c shown in FIG. 4. Meanwhile, the outer wiring structure 300 is cut to form a plurality of second conductive structures 30. In some embodiments, a plurality of external connectors 42 (e.g., solder bumps) may be disposed in the respective ones of the through holes 311 of the second bottom passivation layer 31 to contact the second redistribution layer 32 for external connection.

Figure 32:
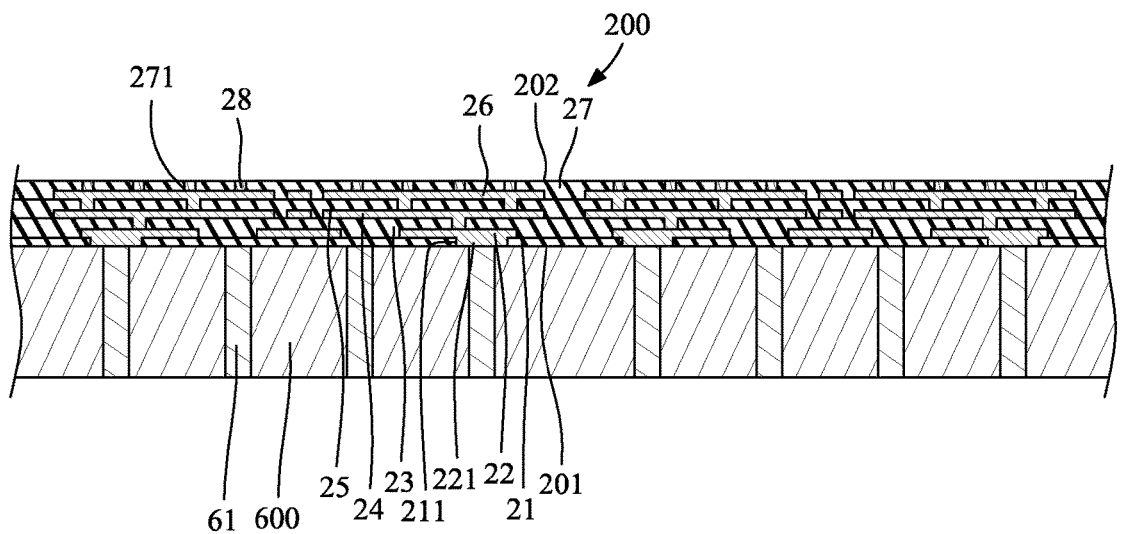
FIG. 32 illustrates one or more stages of some embodiments of a method for manufacturing a semiconductor package structure according to an aspect of the present disclosure.
Figure 33:
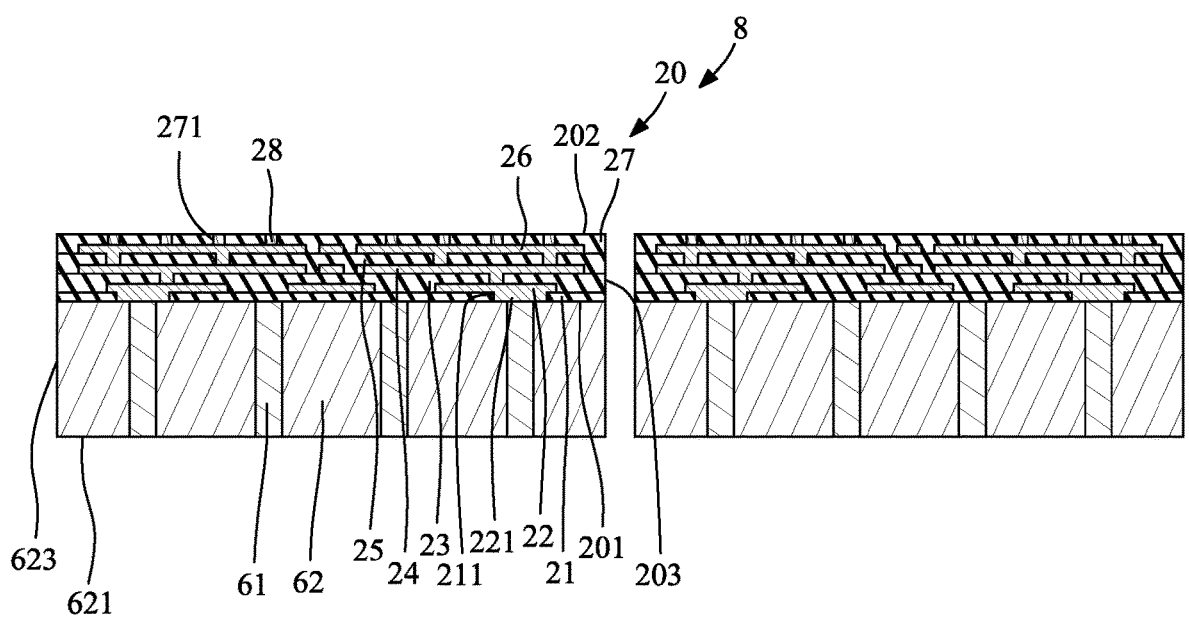
FIG. 33 illustrates one or more stages of some embodiments of a method for manufacturing a semiconductor package structure according to an aspect of the present disclosure.

FIG. 32 through FIG. 33 illustrate various stages of some embodiments of a method for manufacturing a semiconductor package structure according to an aspect of the present disclosure. In some embodiments, the method is for manufacturing a semiconductor package structure such as the semiconductor package structure 1e shown in FIG. 6. Referring to FIG. 32, a fifth carrier 600 is provided. The fifth carrier 600 may include, for example, a metal material, a ceramic material, a glass material, a substrate or a semiconductor wafer. The shape of the fifth carrier 600 may be, for example, substantially rectangular or square. Alternatively, the shape of the fifth carrier 600 may be, for example, substantially circular or elliptical. In some embodiments, the fifth carrier 600 may be an interposer which includes a plurality of through vias 61 extending through the fifth carrier 600. The material of the through via 61 may be copper or another metal. Then, a base wiring structure 200 is formed or disposed on the fifth carrier 600. The extending portion 221 of the first bottom redistribution layer 22 of the base wiring structure 200 may contact the through via 61. Then, the fifth carrier 600 and the base wiring structure 200 are tested and marked to identify known good sub-packages 8 including the fifth carrier 600 and the base wiring structure 200.

Referring to FIG. 33, the fifth carrier 600 and the base wiring structure 200 are cut concurrently to form a sub-package 8. Meanwhile, the fifth carrier 600 is cut to form a plurality of interposer 62, and the base wiring structure 200 is cut to form a plurality of first conductive structures 20. Thus, a lateral surface 623 of the interposer 62 is substantially coplanar with the lateral surface 203 of the first conductive structure 20.

Then, the following stages of the illustrated process are the same as, or similar to, the stages illustrated in FIG. 11 through FIG. 14 so as to obtain the semiconductor package structure 1e shown in FIG. 6. For example, the known good sub-packages 8 are disposed or attached on a carrier. Then, the first semiconductor component (including, for example, at least one high-end semiconductor die 12) is disposed on a respective one of the first conductive structures 20 of the sub-packages 8. Then, the second semiconductor component (including, for example, a low-end semiconductor die 14 and a passive element 16, e.g., an MLCC) is disposed on the carrier. Then, a first encapsulant 18 is formed to cover the sub-packages 8, the second semiconductor component (including, for example, the low-end semiconductor die 14 and the passive element 16, e.g., an MLCC) and the carrier. Then, the carrier is removed. Then, an outer wiring structure is formed or disposed on the first surface 621 of the interposer 62, the first encapsulant 18 and the second semiconductor component (including, for example, the low-end semiconductor die 14 and the passive element 16, e.g., an MLCC) directly. Then, the outer wiring structure and the first encapsulant 18 are singulated to form a plurality of semiconductor package structures 1e shown in FIG. 6. Meanwhile, the outer wiring structure is cut to form a plurality of second conductive structures 30.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Two surfaces can be deemed to be coplanar or substantially coplanar if a displacement between the two surfaces is no greater than 5 µm, no greater than 2 µm, no greater than 1 µm, no greater than 0.5 µm, or no greater than 0.1 µm. A surface can be deemed to be planar or substantially planar if a difference between a highest point and a lowest point of the surface is no greater than 5 µm, no greater than 2 µm, no greater than 1 µm, no greater than 0.5 µm, or no greater than 0.1 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
   (a) forming a base wiring structure on a first carrier, wherein the base wiring structure includes a first redistribution layer;
   (b) singulating the base wiring structure to form a plurality of first conductive structures;
   (c) disposing the first conductive structures on a second carrier;
   (d) disposing a first semiconductor component on one first conductive structure of the first conductive structures;
   (e) forming a first encapsulant to cover the first semiconductor component and a lateral surface of the first conductive structure;
   (f) removing the second carrier;
   (g) singulating the first encapsulant to form a plurality of unit packages;
   (h) disposing the unit packages on a third carrier;
   (i) disposing a second semiconductor component on the third carrier;

(j) forming a second encapsulant to cover the second semiconductor component and the unit packages;
(k) removing the third carrier;
(l) forming an outer wiring structure on the unit packages and the second encapsulant, wherein the outer wiring structure includes a second redistribution layer; and
(m) singulating the outer wiring structure and the second encapsulant.

2. The method of claim 1, wherein after (h), the method further comprises:
(h1) forming a shielding layer to cover the unit packages.

3. The method of claim 2, wherein the shielding layer contacts the third carrier.

* * * * *